US008338196B2

(12) United States Patent
Kumaki et al.

(10) Patent No.: US 8,338,196 B2
(45) Date of Patent: Dec. 25, 2012

(54) LIGHT-EMITTING ELEMENT AND LIGHT EMITTING DEVICE USING THE SAME

(75) Inventors: Daisuke Kumaki, Tokamachi (JP); Satoshi Seo, Kawasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/196,095

(22) Filed: Aug. 2, 2011

(65) Prior Publication Data

US 2011/0278562 A1 Nov. 17, 2011

Related U.S. Application Data

(63) Continuation of application No. 12/503,115, filed on Jul. 15, 2009, now Pat. No. 8,207,555, and a continuation of application No. 10/584,333, filed as application No. PCT/JP2005/020663 on Nov. 4, 2005, now Pat. No. 7,564,052.

(30) Foreign Application Priority Data

Nov. 5, 2004 (JP) ................................. 2004-322995

(51) Int. Cl.
*H01L 21/00* (2006.01)
(52) U.S. Cl. ............ 438/22; 438/37; 438/936; 257/103; 257/101; 257/E51.022; 257/E51.026
(58) Field of Classification Search .................. None
See application file for complete search history.

(56) References Cited

U.S. PATENT DOCUMENTS

| | | |
|---|---|---|
| 5,093,698 A | 3/1992 | Egusa |
| 5,757,026 A | 5/1998 | Forrest et al. |
| 6,013,384 A | 1/2000 | Kido et al. |
| 6,150,043 A | 11/2000 | Thompson et al. |
| 6,344,283 B1 | 2/2002 | Inoue et al. |
| 6,423,429 B2 | 7/2002 | Kido et al. |

(Continued)

FOREIGN PATENT DOCUMENTS

EP    1 029 909    8/2000

(Continued)

OTHER PUBLICATIONS

International Search Report (Application No. PCT/JP2005/020663) dated Feb. 21, 2006.

(Continued)

*Primary Examiner* — Benjamin Sandvik
*Assistant Examiner* — Scott R Wilson
(74) *Attorney, Agent, or Firm* — Eric J. Robinson; Robinson Intellectual Property Law Office, P.C.

(57) ABSTRACT

The present invention provides a light-emitting element having less increase in driving voltage with the accumulation of light-emission time, and provides a light-emitting element having less increase in resistance value with the increase in film thickness. A light-emitting element includes a first layer, a second layer and a third layer between a first electrode and a second electrode. The first layer is provided to be closer to the first electrode than the second layer, and the third layer is provided to be closer to the second electrode than the second layer. The first layer is a layer including an aromatic amine compound and a substance showing an electron accepting property to the aromatic amine compound. The second layer includes a substance of which an electron transporting property is stronger than a hole transporting property, and a substance showing an electron donating property to the aforementioned substance.

18 Claims, 30 Drawing Sheets

U.S. PATENT DOCUMENTS

| | | |
|---|---|---|
| 6,483,236 B1 | 11/2002 | Hung |
| 6,541,129 B1 | 4/2003 | Kawamura et al. |
| 6,566,807 B1 | 5/2003 | Fujita et al. |
| 6,632,545 B1 | 10/2003 | Kido et al. |
| 6,717,358 B1 | 4/2004 | Liao et al. |
| 6,841,267 B2 | 1/2005 | Brown et al. |
| 6,861,800 B2 | 3/2005 | Tyan et al. |
| 6,881,501 B2 | 4/2005 | Yudasaka |
| 6,917,159 B2 | 7/2005 | Tyan et al. |
| 6,936,961 B2 | 8/2005 | Liao et al. |
| 6,942,534 B2 | 9/2005 | Shibasaki et al. |
| 6,991,859 B2 | 1/2006 | Klubek et al. |
| 7,015,324 B2 | 3/2006 | Nomura et al. |
| 7,059,928 B2 | 6/2006 | Ikeda |
| 7,141,817 B2 | 11/2006 | Nishi et al. |
| 7,180,089 B2 | 2/2007 | Wu et al. |
| 7,239,081 B2 | 7/2007 | Tsutsui |
| 7,399,537 B2 | 7/2008 | Kawamura et al. |
| 7,416,464 B2 | 8/2008 | Ikeda |
| 7,560,735 B2 | 7/2009 | Furukawa et al. |
| 7,569,988 B2 | 8/2009 | Ikeda et al. |
| 7,598,670 B2 | 10/2009 | Kumaki et al. |
| 7,601,435 B2 | 10/2009 | Shitagaki et al. |
| 7,615,921 B2 | 11/2009 | Kimura |
| 7,893,427 B2 | 2/2011 | Kumaki et al. |
| 7,956,349 B2 | 6/2011 | Tsutsui et al. |
| 2003/0143430 A1 | 7/2003 | Kawamura et al. |
| 2003/0189401 A1 | 10/2003 | Kido et al. |
| 2004/0140757 A1 | 7/2004 | Tyan et al. |
| 2004/0140758 A1 | 7/2004 | Raychaudhuri et al. |
| 2004/0155576 A1 | 8/2004 | Tyan et al. |
| 2005/0098207 A1 | 5/2005 | Matsumoto et al. |
| 2006/0008740 A1 | 1/2006 | Kido et al. |
| 2006/0033452 A1 | 2/2006 | Yamazaki et al. |
| 2006/0180812 A1 | 8/2006 | Sakata et al. |
| 2007/0114527 A1 | 5/2007 | Kumaki et al. |
| 2008/0241586 A1 | 10/2008 | Kumaki et al. |

FOREIGN PATENT DOCUMENTS

| | | |
|---|---|---|
| EP | 1175130 A | 1/2002 |
| EP | 1 351 558 | 10/2003 |
| EP | 1439588 A | 7/2004 |
| EP | 1439589 A | 7/2004 |
| EP | 1 530 245 | 5/2005 |
| EP | 1 616 864 | 1/2006 |
| EP | 1 617 493 | 1/2006 |
| JP | 06-267658 | 9/1994 |
| JP | 08-288064 | 11/1996 |
| JP | 10-270171 | 10/1998 |
| JP | 10-270172 | 10/1998 |
| JP | 11-297474 | 10/1999 |
| JP | 11-307264 | 11/1999 |
| JP | 2000-036390 A | 2/2000 |
| JP | 2000-243576 A | 9/2000 |
| JP | 2000-309566 | 11/2000 |
| JP | 2001-223084 A | 8/2001 |
| JP | 2002-367784 | 12/2002 |
| JP | 2003-272860 | 9/2003 |
| JP | 2004-055177 A | 2/2004 |
| JP | 2004-178981 | 6/2004 |
| JP | 2004-200031 | 7/2004 |
| JP | 2004-228081 A | 8/2004 |
| JP | 2005-166637 | 6/2005 |
| JP | 2005-251587 | 9/2005 |
| JP | 2006-024791 | 1/2006 |
| WO | WO-2004/064453 | 7/2004 |
| WO | WO 2004/094389 | 11/2004 |

OTHER PUBLICATIONS

Written Opinion (Application No. PCT/JP2005/020663) dated Feb. 21, 2006.

Thomas et al., *Quinoxalines Incorporating Triarylamines: Potential Electroluminescent Materials with Tunable Emission Characteristics*, Chemistry of Materials, 2002, vol. 14 , No. 6 , pp. 2796-2802.

Tokito et al., *Metal Oxides as a Hole-Injecting Layer for an Organic Electroluminescent Device*, Journal of Physics D: Applied Physics, 1996, vol. 29, pp. 2750-2753.

Terai. K et al., "Organic Thin-film Diodes with Electric Field Assisted Bipolar Charge Spouting Zone,", 51st Spring Meeting the Japan Society of Applied physics and Related Societies, Mar. 28, 2004, No. 3, p. 1464.

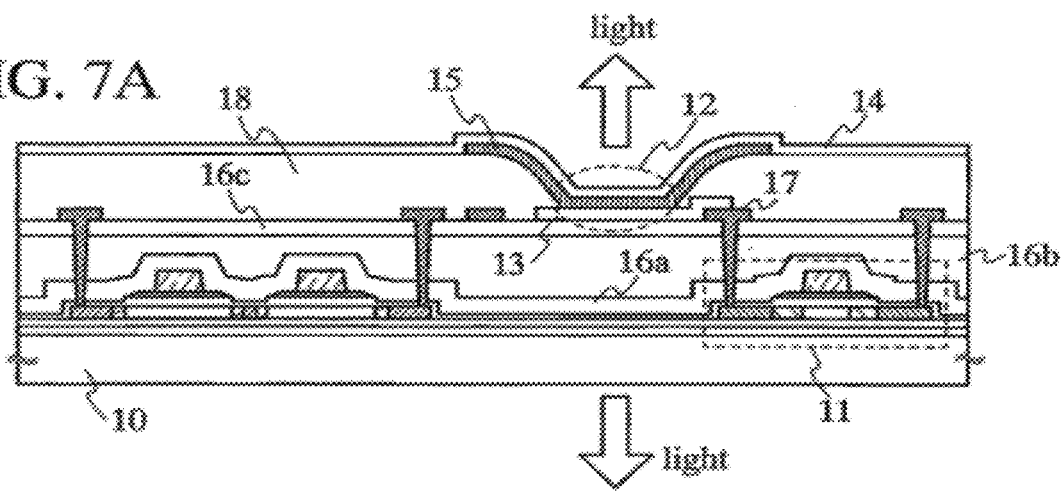
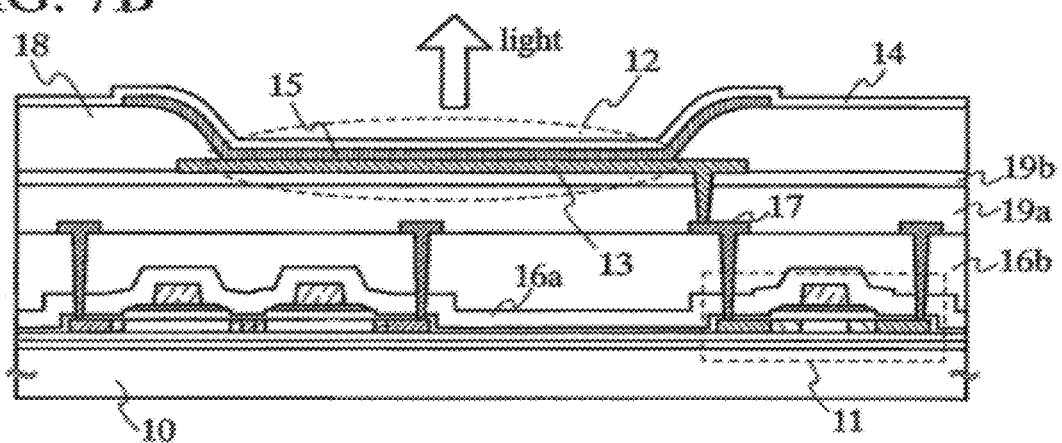
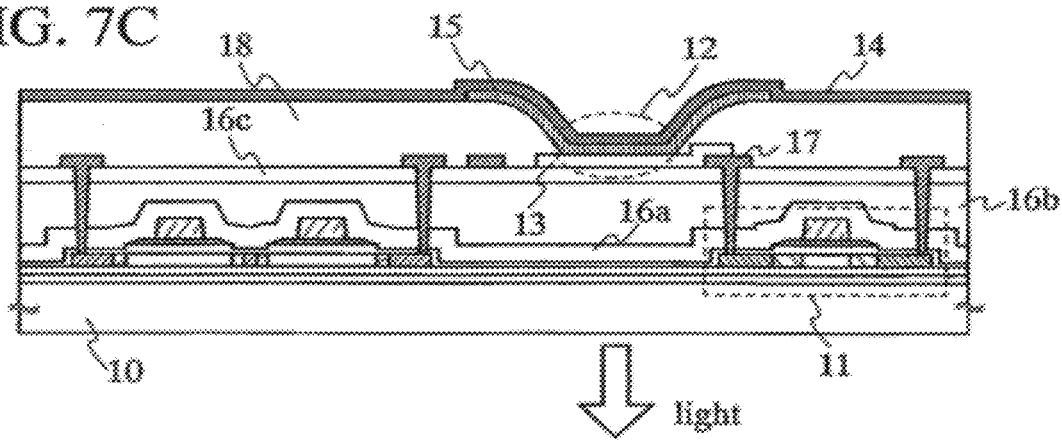

LIGHT-EMITTING ELEMENT AND LIGHT EMITTING DEVICE USING THE SAME

TECHNICAL FIELD

The present invention relates to a light-emitting element comprising a layer including a light-emitting substance between a pair of electrodes, and in particular, relates to a structure of a light-emitting element.

BACKGROUND ART

In recent years, a large number of light-emitting elements used for display devices and the like each have a structure in which a layer including a light-emitting substance is sandwiched between a pair of electrodes. Such a light-emitting element emits light when an excited electron, which is formed by a recombination of an electron injected from one electrode and a hole injected from the other electrode, returns to a ground state.

A large number of these light-emitting elements have a problem in that the driving voltage is increased with the accumulation of light-emission time.

In order to solve this problem, for example, the patent document 1 discloses an organic EL element using a compound with a certain structure, wherein the increase in driving voltage, and the like are suppressed in driving the organic EL element.

[Patent Document 1]: International Publication WO98/30071

DISCLOSURE OF INVENTION

It is an object of the present invention to provide a light-emitting element having less increase in driving voltage with the accumulation of light-emission time. It is another object of the present invention to provide a light-emitting element having less increase in resistance value with the increase in film thickness.

In an aspect of the present invention, a light-emitting element includes a first layer, a second layer and a third layer between a first electrode and a second electrode that are provided to face each other. The first, second and third layers are sequentially stacked to interpose the second layer between the first and third layers. The first layer is in contact with the first electrode and the third layer is in contact with the second electrode. The first layer is a layer generating holes while the second layer is a layer generating electrons. The third layer includes a light-emitting substance. The second layer and the third layer are in contact with each other so as to inject electrons generated in the second layer into the third layer, when voltage is applied such that a potential of the second electrode is higher than that of the first electrode. In this manner, light is emitted.

In another aspect of the present invention, a light-emitting element includes a first layer, a second layer and a third layer between a first electrode and a second electrode that are provided to face each other. The first, second and third layers are sequentially stacked to interpose the second layer between the first and third layers. The first layer is in contact with the first electrode and the third layer is in contact with the second electrode. The first layer is a layer including an aromatic amine compound and a substance showing an electron accepting property to the aromatic amine compound. The second layer includes a substance of which an electron transporting property is stronger than a hole transporting property, and a substance showing an electron donating property to the substance of which the electron transporting property is stronger than the hole transporting property. Also, the third layer includes a light-emitting substance. The second and third layers are in contact with each other so as to inject electrons generated in the second layer into the third layer, when voltage is applied such that a potential of the second electrode is higher than that of the first electrode. In this manner, light is emitted.

In another aspect of the present invention, a light-emitting element includes a first layer, a second layer and a third layer between a first electrode and a second electrode that are provided to face each other. The first layer is provided to be closer to the first electrode than the second layer, and the third layer is provided to be closer to the second electrode than the second layer. The first layer is a layer generating holes, and the second layer is a layer generating electrons. The third layer includes a light-emitting substance. The second and third layers are in contact with each other so as to inject electrons generated in the second layer into the third layer, when voltage is applied such that a potential of the second electrode is higher than that of the first electrode. In this manner, light is emitted.

In another aspect of the present invention, a light-emitting element includes a first layer, a second layer and a third layer between a first electrode and a second electrode that are provided to face each other. The first layer is provided to be closer to the first electrode than the second layer, and the third layer is provided to be closer to the second electrode than the second layer. The first layer is a layer including an aromatic amine compound and a substance showing an electron accepting property to the aromatic amine compound. The second layer includes a substance of which an electron transporting property is stronger than a hole transporting property, and a substance showing an electron donating property to the substance of which the electron transporting property is stronger than the hole transporting property. Also, the third layer includes a light-emitting substance. The second and third layers are in contact with each other so as to inject electrons generated in the second layer into the third layer, when voltage is applied such that a potential of the second electrode is higher than that of the first electrode. In this manner, light is emitted.

In another aspect of the present invention, a light-emitting element includes a first layer, a second layer and a third layer between a first electrode and a second electrode that are provided to face each other. The first, second and third layers are sequentially stacked to interpose the second layer between the first and third layers. The first layer is a layer including an aromatic amine compound and a substance showing an electron accepting property to the aromatic amine compound. The second layer includes a substance of which an electron transporting property is stronger than a hole transporting property, and a substance showing an electron donating property to the substance of which the electron transporting property is stronger than the hole transporting property. The third layer has x layers (x is a given positive integer) including a light-emitting layer. One layer included in the third layer is in contact with the second layer and the x-th layer thereof is in contact with the second electrode. The first electrode includes a conductive material having high reflectance. There are y layers (y<x wherein y is a positive integer) between the light-emitting layer of the third layer and the second layer. The second layer and the above one layer of the third layer contacting to the second layer are in contact with each other so as to inject electrons generated in the second layer into the above one layer of the third layer, when voltage is applied such that a potential of the second electrode is higher than that of the first electrode. In this manner, light is emitted. Also, the thicknesses of the first and second layers are adjusted to satisfy the following expressions 1, 2 and 3:

$$n_i d_i + n_{ii} d_{ii} + \sum_{k=1}^{y} n_k d_k + n_j d_j = \frac{(2m-1)\lambda}{4} \quad 1$$

$$0 \leq d_j \leq d_{emi} \quad 2$$

$$d_i \geq d_{ii} \quad 3$$

In the expressions 1, 2 and 3, $n_i$ indicates the refractive index of the first layer; $d_i$, the thickness of the first layer; $n_{ii}$, the refractive index of the second layer; $d_{ii}$, the thickness of the second layer; $n_k$, the refractive index of the k-th layer (k is a natural number) of the layers interposed between the light-emitting layer and the second layer; $d_k$, the thickness of the k-th layer of the layers interposed between the light-emitting layer and the second layer; $n_j$, the refractive index of the light-emitting layer; $d_j$, a distance between a first-electrode-side surface of the light-emitting layer and a light-emitting region; $\lambda$, a wavelength of light emitted from the light-emitting element; m, a given positive integer; and $d_{emi}$, the thickness of the light-emitting layer.

According to the present invention, a highly reliable light-emitting element having less increase in driving voltage with the accumulation of light-emission time can be obtained.

In addition, a light-emitting element having less increase in resistance value depending on the thickness of a layer generating holes, can be obtained according to the present invention. As a result, a light-emitting element in which a distance between electrodes can be changed easily, can be obtained. Also, a short circuit between the electrodes, due to unevenness of the surfaces of the electrodes, can be prevented by increasing the distance between the electrodes. Additionally, by controlling the distance between the electrodes, an optical distance can be easily controlled such that a maximum light-extraction efficiency can be obtained. In addition, by controlling the distance between the electrodes, an optical distance can be controlled easily so that the variation in emission spectrum depending on the angle between the light-extraction surface and the viewer's line of sight is reduced.

Furthermore, by applying a light-emitting element obtained according to the present invention to a light-emitting device, a highly reliable light-emitting device that can withstand long-time use can be obtained. Moreover, by applying the light-emitting element obtained according to the present invention, to a light-emitting device having a display function, it is possible to obtain a light-emitting device in which light can be emitted to the outside efficiently, and which can display high-definition images with smaller variation in the emission spectrum depending on the angle between the light-extraction surface and the viewer's line of sight.

BRIEF DESCRIPTION OF DRAWINGS

In the accompanying drawings:

FIGS. 7A to 7C are each a cross sectional view of a light-emitting device to which the present invention is applied;

BEST MODE FOR CARRYING OUT THE INVENTION

Embodiment modes of the present invention will hereinafter be described with reference to the accompanying drawings. Note that the present invention can be carried out in many different modes. It is easily understood by those skilled in me art that the embodiment modes and details herein disclosed can be modified in various ways without departing from the spirit and the scope of the present invention. The present invention should not be interpreted as being limited to the description of the embodiment modes to be given below.
Embodiment Mode 1

Figure 1:
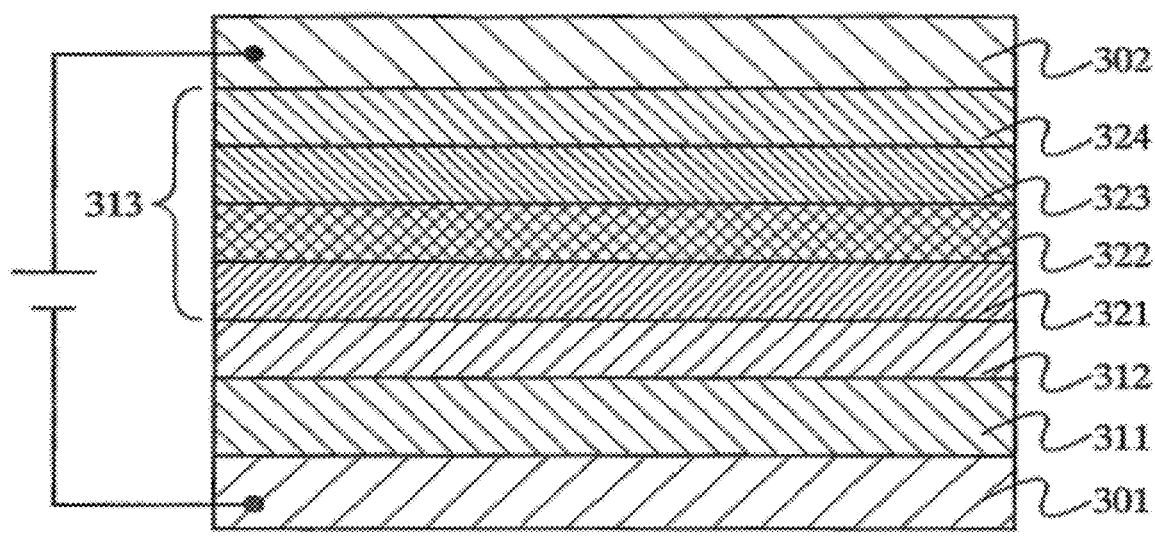
FIG. 1 shows one mode of a stacked structure of a light-emitting element according to the present invention.

One mode of the present invention will be described with reference to a cross sectional view of a light-emitting element as shown in FIG. 1.

The light-emitting element includes a first layer 311, a second layer 312 and a third layer 313 between a first electrode 301 and a second electrode 302. The first layer 311, the second layer 312 and the third layer 313 are stacked sequentially. The first layer 311 is in contact with the first electrode 301 and the third layer 313 is in contact with the second electrode 302.

The light-emitting element of this embodiment mode is operated as follows. When voltage is applied such that a potential of the second electrode 302 is higher than that of the first electrode 301, holes are injected into the first electrode 301 from the first layer 311 while electrons are injected into the third layer 313 from the second layer 312. Also, holes are injected into the third layer 313 from the second electrode 302. The holes injected from the second electrode 302 and the electrons injected from the second layer 312 are recombined in the third layer 313, so that a light-emitting substance is excited. The light-emitting substance emits light when returning to a ground state from the excited state.

Hereinafter, each of the layers, electrodes and the like will be described in more detail below.

The first layer 311 is a layer generating holes. As the layer generating holes, for example, a layer containing an aromatic amine compound and a substance that shows an electron accepting property to the aromatic amine compound is preferably used. Here, the aromatic amine compound is a substance having an aryl amine skeleton. Among such aromatic amine compounds, particularly, a substance including triphenilamine in its skeleton and having a molecular weight of 400 or more is preferable. In addition, among the aromatic amine compounds including triphenilamine in their skeleton, an aromatic amine including a fused aromatic ring such as a naphthyl group in its skeleton is preferable particularly. By using an aromatic amine compound including triphenilamine and fused aromatic ring in its skeleton, heat resistance of a light-emitting element is increased. For example, an aromatic amine compound such as 4,4'-bis[N-(1-naphthyl)-N-phenylamino]biphenyl (α-NPD); 4,4'-bis[N-(3-methylphenyl]-N-phenylamino]biphenyl (TPD); 4,4',4"-tris(N,N-diphenylamino)triphenylamine (TDATA); 4,4',4"-tris[N-(3-methylphenyl)-N-phenylamino]triphenylamine (MTDATA); and 4,4'-bis{N[4-(N,N-di-m-tolylamino)phenyl]-N-phenylaminobiphenyl}-(DNTPD); 1,3,5-tris[N,N-di(m-tolyl)amino]benzene (m-MTDAB); 4,4',4"-tris(N-carbazolyl)-triphenylamine (TCTA); 2,3-bis(4-diphenylaminophenyl) quinoxaline (TPAQn); 2,2',3,3'-tetrakis(4-diphenylaminophenyl)-6,6'-bisquinoxaline (D-TriPhAQn); 2,3-bis{4-[N-(1-naphthyl)-N-phenylamino]phenyl}-dibenzo[f,h]quinoxaline (NPADiBzQn); and the like can be given. Also, the substance having the electron accepting property with respect to the aromatic amine compound is not especially limited. For example, molybdenum oxide, vanadium oxide, 7,7,8,8-tetracyanoquinodimethane (TCNQ), 2,3,5,6-tetrafluoro-7,7,8,8-tetracyanoquinodimethane (F4-TCNQ), and the like can be used. The first layer 311 preferably includes the substance that shows the electron accepting property to the aromatic amine compound so that the value a molar ratio (i.e., the substance showing the electron accepting property to the aromatic amine compound/the aromatic amine compound) is in the range of 0.5 to 2.

The second layer 312 is a layer generating electrons. As the layer generating electrons, for example, a layer including a substance with an electron transporting property and a substance that shows an electron donating property to the substance with the electron transporting property, can be given. The substance with the electron transporting property is a substance of which an electron transporting property is stronger than a hole transporting property. The substance with the electron transporting property is not especially limited. For example, a metal complex such as tris(8-quinolinolato)aluminum (Alq$_3$); tris(4-methyl-8-quinolinolato)aluminum (Almq$_3$); bis(10-hydroxybenzo[h]quinolinato)beryllium (BeBq$_2$); bis(2-methyl-8-quinolinolato)-4-phenylphenolate-aluminum (BAlq); bis[2-(2-hydroxyphenyl)benzoxazolate] zinc (Zn(BOX)$_2$); and bis[2-(2-hydroxyphenyl)benzothiazolate]zinc (Zn(BTZ)$_2$) can be used. In addition, the following substances can also be used as the substance with the electron transporting property: 2-(4-biphenylyl)-5-(4-tert-butylphenyl)-1,3,4-oxadiazole (PBD); 1,3-bis[5-(p-tert-butylphenyl)-1,3,4-oxadiazole-2-yl]benzene (OXD-7); 3-(4-tert-butylphenyl)-4-phenyl-5-(4-biphenylyl)-1,2,4-triazole (TAZ); 3-(4-tert-butylphenyl)-4-(4-ethylphenyl)-5-(4-biphenylyl)-1,2,4-triazole (p-EtTAZ); bathophenanthroline (BPhen); bathocuproin (BCP); and the like. Also, the substance that shows the electron donating property to the substance with the electron transporting property is not especially limited. For example, alkali metals such as lithium and cesium, alkali earth metals such as magnesium and calcium, rare-earth metal such as erbium and ytterbium, and the like can be used. Further, a substance selected from the group consisting of alkali metal oxides or alkali earth metal oxides, such as lithium oxide (Li$_2$O), calcium oxides (CaO), sodium oxide (Na$_2$O), potassium oxide (K$_2$O), and magnesium oxide (MgO), may be used as the substance showing the electron donating property to the electron transporting substance. Note that alkali metal oxides, alkali earth metal oxides, and the like are easy to treat, since they are less reactive. Preferably, the second layer 312 includes the substance having the electron donating property with respect to the substance with the electron transporting property so the a molar ratio value (i.e., the substance having the electron donating property with respect to the substance with the electron transporting property/the substance with the electron transporting property) is in the range of 0.5 to 2. Additionally, the second layer 312 may be of an n-type semiconductor such as zinc oxide, zinc sulfide, zinc selenide, tin oxide and titanium oxide.

The third layer 313 contains a light-emitting layer. The layer structure of the third layer 313 is not especially limited, and it may include either a single layer or multiple layers. For example, as shown in FIG. 1, the third layer 313 may include an electron transporting layer 321, a hole transporting layer 323 and a hole injecting layer 324 along with the light-emitting layer 322. Alternatively, the third layer 313 may include only the light-emitting layer.

The light-emitting layer 322 contains a light-emitting substance. Here, the light-emitting substance is a substance that can emit light with a desired wavelength and has an excellent emission efficiency. The third layer 313 is not especially limited, but it is preferably a layer in which a light-emitting substance is dispersed in the layer wherein the energy gap of a substance forming the layer is larger than the energy gap of the light-emitting substance. Accordingly, light emitted from the light-emitting substance can be prevented from going out due to the concentration of the light-emitting substance. Further, the energy gap indicates an energy gap between the LUMO level and the HOMO level.

The light-emitting substance is not especially limited. A substance capable of emitting light with a desired wavelength and having an excellent emission efficiency may be used. In order to obtain red light emission, for example, the following substances exhibiting emission spectrum with peaks at 600 to 680 nm can be employed: 4-dicyanomethylene-2-isopropyl-6-[2-(1,1,7,7-tetramethyljulolidene-9-yl)ethenyl]-4H-pyran (DCJTI); 4-dicyanomethylene-2-methyl-6-[2-(1,1,7,7-tetramethyljulolidine-9-yl)ethenyl]-4H-pyran (DCJT); 4-dicyanomethylene-2-tert-butyl-6-[2-(1,1,7,7-tetramethyljulolidine-9-yl)ethenyl]-4H-pyran (DCJTB); periflanthene; 2,5-dicyano-1,4-bis[2-(10-methoxy-1,1,7,7-tetramethyljulolidine-9-yl)ethenyl]benzene and the like. In order to obtain green light emission, substances exhibiting emission spectrum with peaks at 500 to 550 nm such as N,N'-dimethylquinacridon (DMQd); coumarin 6; coumarin 545T; and tris(8-quinolinolate)aluminum ($Alq_3$) can be employed. In order to obtain blue light emission, the following substances exhibiting emission spectrum with peaks at 420 to 500 nm can be employed: 9,10-bis(2-naphthyl)-tert-butylanthracene (t-BuDNA); 9,9'-bianthryl; 9,10-diphenylanthracene (DPA); 9,10-bis(2-naphthyl)anthracene (DNA); bis(2-methyl-8-quinolinolate)-4-phenylphenolate-gallium (BGaq); bis(2-methyl-8-quinolinolate)-4-phenylphenolate-aluminum (BAlq); and the like. As described above, in addition to such substances emitting fluorescence, substances emitting phosphorescence such as bis[2-(3,5-bis(trifluorometyl) phenylpyridinato-$N,C^{2'}$]iridium(III)picolinato (Ir($CF_3ppy$)$_2$(pic)); bis[2-(4,6-difluorophenyl)pyridinato)-N,$C^{2'}$]iridium(III)acetylacetonato (FIr(acac)); bis[2-(4,6-difluorophenyl)pyridinato-N,$C^{2'}$]iridium(III)picolinato (FIr(pic)); and tris(2-phenylpyridinato-N,$C^{2'}$)iridium (Ir(ppy)$_3$) can also be used as the light-emitting substance.

A substance used for dispersing a light-emitting substance is not especially limited. For example, an anthracene derivative such as 9,10-di(2-naphthyl)-2-tert-butylanthracene (t-BuDNA), a carbazole derivative such as 4,4'-bis(N-carbazolyl)biphenyl (CBP), a metal complex such as bis[2-(2-hydroxyphenyl)pyridinato]zinc ($Znpp_2$) and bis[2-(2-hydroxyphenyl)benzoxazolato]zinc ($ZnBOX_2$), and the like can be used.

In a light-emitting element as described above, the difference in electron affinities, between the substance with the electron transporting property within the second layer 312, and a substance within a layer of the third layer 313, that is in contact with the second layer 312, is preferably set to be 2 eV or less; more preferably, 1.5 eV or less. When the second layer 312 is made using an n-type semiconductor, the difference between a work function of the n-type semiconductor and the electron affinity of the substance within the layer of the third layer 313, that is in contact with the second layer 312, is preferably set to be 2 eV or less; more preferably, 1.5 eV or less.

Further, the layer of the third layer 313, that is in contact with the second layer 312 corresponds to the electron transporting layer 321 when the third layer 313 has a structure shown in this embodiment mode. When the third layer 313 includes only a light-emitting layer, or, when the third layer 313 does not include the electron transporting layer 321 or the like, the light-emitting layer corresponds to this layer in contact with the second layer 312. When the light-emitting layer is in contact with the second layer 312, a substance within the layer of the third layer 313, that is in contact with the second layer 312, corresponds to a substance for dispersing the light-emitting substance or the light-emitting substance itself. This is because, in the case of using a light-emitting substance, like $Alq_3$, which can emit light without being dispersed, and which has an excellent carrier transporting property, the layer made from the light-emitting substance itself can function as a light-emitting layer without being dispersed. Therefore, by making the third layer 313 be in contact with the second layer 312, electrons can easily be injected into the third layer 313 from the second layer 312.

Preferably, one or both of the first electrode 301 and the second electrode 302 is/are formed by using a conductive substance capable of transmitting visible light. Accordingly, light generated in the light-emitting layer can be emitted to the outside through at least one of the first electrode 301 and the second electrode 302.

The first electrode 301 is not especially limited. For example, aluminum, indium tin oxide (ITO), indium tin oxide containing silicon oxide, indium oxide containing zinc oxide of 2 to 20 wt % can be used as the first electrode. Additionally, gold (Au), platinum (Pt), nickel (Ni), tungsten (W), chromium (Cr), molybdenum (Mo), iron (Fe), cobalt (Co), copper (Cu), palladium (Pd) and the like can be used.

Also, the second electrode 302 is not especially limited; however, when the second electrode 302 has a function of injecting holes into the third layer 313 like the light-emitting element of this embodiment mode, the second electrode 302 is preferably made from a substance having a high work function. Specifically, indium tin oxide (ITO), indium tin oxide containing silicon oxide, indium oxide containing zinc oxide of 2 to 20 wt %, gold (Au), platinum (Pt), nickel (Ni), tungsten (W), chromium (Cr), molybdenum (Mo), iron (Fe), cobalt (Co), copper (Cu), palladium (Pd) and the like can be used. Further, the second electrode 302 can be formed, for instance, by sputtering, evaporation, or the like.

As described above, the electron transporting layer 321 is interposed between the second layer 312 and the light-emitting layer 322, in this embodiment mode. The electron transporting layer 321 has a function of transporting the injected electrons to the light-emitting layer 322. By providing the electron transporting layer 321 to isolate the first electrode 301 and the second layer 312 from the light-emitting layer 322, it can prevent the light generated in the light-emitting layer from being quenched by the metal.

The electron transporting layer 321 is not especially limited and can be formed using an electron transporting substance, for example, $Alq_3$, $Almq_3$, $BeBq_2$, BAlq, $Zn(BOX)_2$, $Zn(BTZ)_2$, PBD, OXD-7, TAZ, p-EtTAZ, BPhen, BCP, and the like. In particular, the electron transporting layer 321 is preferably formed using an electron transporting substance having an electron mobility of $1\times10^{-6}$ $cm^2/Vs$ or more, among such electron transporting substances. Thus, the driving voltage of the light-emitting element can be decreased. Further, the electron transporting layer 321 may have a multilayer structure formed by stacking two or more layers including the above described substances.

In this embodiment mode, a hole transporting layer 323 is provided between the second electrode 302 and the light-emitting layer 322 as shown in FIG. 1. The hole transporting layer 323 has a function of transporting the holes injected from the second electrode 302 to the light-emitting layer 322. By providing the hole transporting layer 323 to create distance the second electrode 302 and the light-emitting layer 322, light generated in the light-emitting layer can be prevented from being quenched by the metal.

The hole transporting layer 323 is not especially limited, and can be formed using a hole transporting substance. Here, the hole transporting substance is a substance of which the hole mobility is higher than the electron mobility. TPD, TDATA, MTDATA, DNTPD, m-MTDAB, TCTA, phthalocyanine ($H_2PC$), copper phthalocyanine (CuPc), vanadium phthalocyanine (VOPc), and the like can be used as such hole transporting substances. Also, the hole transporting layer 323 is preferably formed using a substance having a hole mobility of $1\times10^{-6}$ cm$^2$/Vs or more, among such hole transporting substances. Thus, driving voltage of a light-emitting element can be decreased. The hole transporting layer 323 may have a multilayer structure formed by stacking two or more layers made from the above-described substances.

As shown in FIG. 1, the hole injecting layer 324 may be provided between the second electrode 302 and the hole transporting layer 323. The hole injecting layer 324 has a function of assisting the injection of holes into the hole transporting layer 323 from the second electrode 302.

The hole injecting layer 324 is not especially limited. The hole injecting layer can be formed by using a metal oxide such as molybdenum oxide, vanadium oxide, ruthenium oxide, tungsten oxide or manganese oxide. In addition, the hole injecting layer 324 can be formed by using the above-described phthalocyanine compound such as $H_2Pc$, CuPC and VOPc, the aromatic amine compound such as DNTPD, or a high molecular weight material such as a poly(ethylenedioxythiophene)/poly(styrene sulfonate)mixture (PEDOT/PSS). Furthermore, the hole injecting layer 324 may be formed by mixing at least one substance selected from the group consisting of aromatic amine compounds or hole transporting substances, and a substance showing an electron accepting property to the substance.

The above-described light-emitting element of the present invention is a highly reliable light-emitting element in which the increase in driving voltage with the accumulation of light-emission time, is small. Further, the voltage applied to obtain a certain luminance is referred to as driving voltage herein.

In the light-emitting element of the present invention, changes in the applied voltage are few, in feeding a desired current, which depends on the film thickness of the layer generating the holes (the first layer 311). Therefore, for example, by increasing the thickness of the first layer 311 to increase the distance between the first and second electrodes, a short circuit between the first -electrode 301 and the second electrode 302 can be easily prevented.

Embodiment Mode 2

Figure 24:
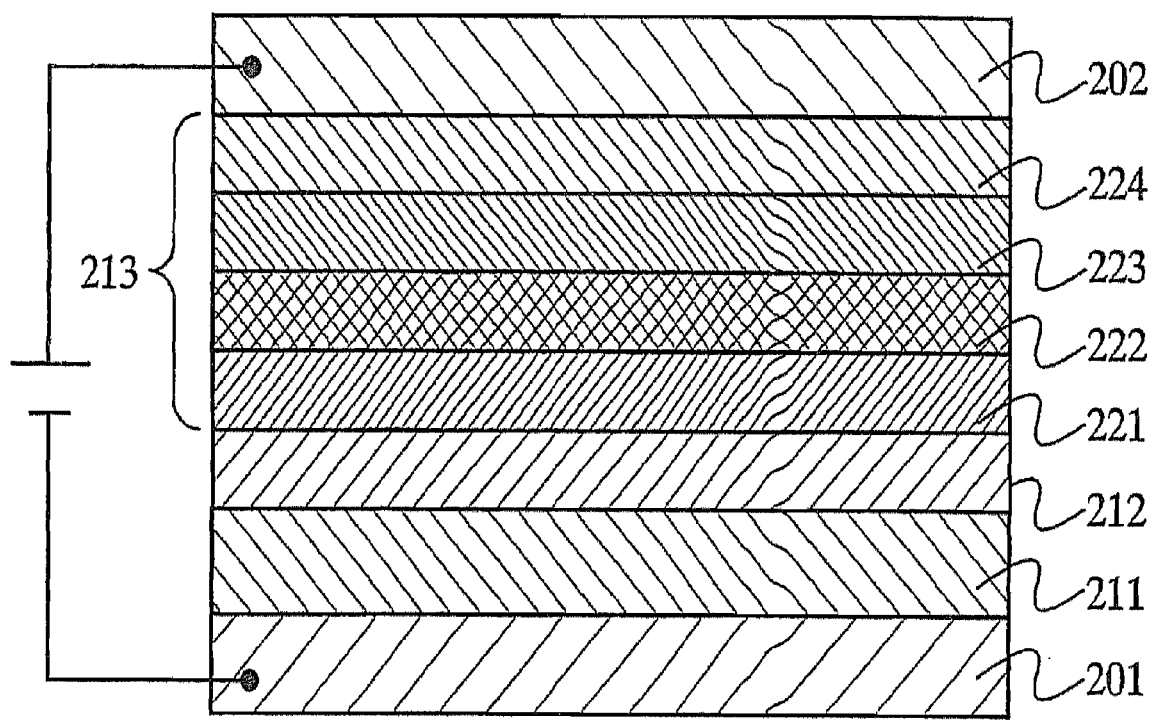
FIG. 24 shows one mode of a stacked structure of a light-emitting element according to the present invention.
Figure 25:
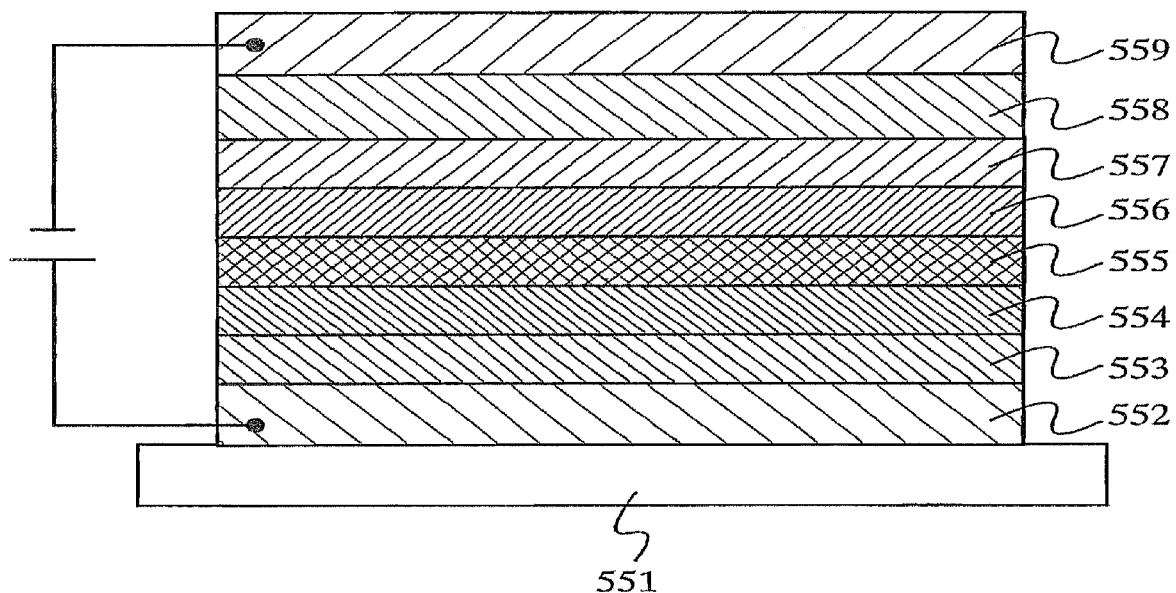
FIG. 25 shows a stacked structure of a light-emitting element according to the present invention.

This embodiment mode will describe a light-emitting element in which, by controlling the thickness of a layer generating holes, a light extraction efficiency is increased and an optical distance between an reflecting surface and a light-extraction surface (or a light-emitting region) is controlled to reduce changes in emission spectrum depending on an angle between the light-extraction surface and the viewer's line of sight, with reference to FIG. 24.

A light-emitting element shown in FIG. 24 comprises a first layer 211 generating holes, a second layer 212 generating electrons, and a third layer 213 containing a light-emitting substance between a first electrode 201 and a second electrode 202. The first layer 211, the second layer 212 and the third layer 213 are stacked sequentially with the second layer 212 interposed between the first and third layers. The first layer 211 is in contact with the first electrode 201 while the third layer 213 is in contact with the second electrode 202.

The first electrode 201 is an electrode made with a conductive material having high reflectance, or, a reflecting electrode. As the conductive material having the high reflectance, aluminum, silver, an alloy of these metals (e.g., an Al:Li alloy, an Mg:Ag alloy etc.) and the like can be used. The conductive material preferably has the reflectance of 50 to 100%. The second electrode 202 is made with a conductive material which can transmit visible light. The conductive material which can transmit visible light is not especially limited, and indium tin oxide, indium tin oxide containing silicon oxide, indium oxide containing zinc oxide of 2 to 20 wt %, or the like can be used.

When voltage is applied such that a potential of the second electrode 202 is higher than that of the first electrode 201, holes are injected into the first electrode 201 from the first layer 211 while electrons are injected into the third layer 213 from the second layer 212. Also, holes are injected into the third layer 213 from the second electrode 202.

The electrons and holes are recombined in the third layer 213, so that a light-emitting substance is excited. The light-emitting substance emits light upon retuning to the ground state from the excited state. A region in which light is generated in this way is referred to as a light-emitting region. A layer including a light-emitting substance for forming the light-emitting region is referred to as a light-emitting layer. Further, the light-emitting region is formed at least in a part of the light-emitting layer.

In the light-emitting element of this embodiment mode, the third layer 213 includes an electron transporting layer 221, a hole transporting layer 223 and a hole injecting layer 224, along with the light-emitting layer 222. Further, the structure of the third layer 213 is not limited to the one shown in FIG. 24. For instance, the third layer 213 may have a single layer structure including only the light-emitting layer.

The first layer 211, the second layer 212 and the third layer 213 may be formed using the same materials of the first layer 311, the second layer 312 and the third layer 313 as described in Embodiment Mode 1, respectively. Similarly, the electron transporting layer 221, the light-emitting layer 222, the hole transporting layer 223 and the hole injecting layer 224 may be formed using the same materials of the electron transporting layer 321, the light-emitting layer 322, the hole transporting layer 323 and the hole injecting layer 324 as described in Embodiment Mode 1, respectively.

When light enters the reflecting electrode, a phase inversion is caused in the reflected light. By the effect of interference of light due to the phase inversion, when an optical distance between the light-emitting region and the reflecting electrode (i.e., refractive index×distance) is the emission wavelength multiplied by $(2m-1)/4$ (m is a given positive integer), or, when the optical distance is the emission wavelength multiplied by $\frac{1}{4}$, $\frac{3}{4}$, $\frac{5}{4}$ . . . , the light extraction efficiency is increased. Meanwhile, when the optical distance therebetween is the emission wavelength multiplied by m/2 (m is a given positive integer), or, the emission wavelength multiplied by $\frac{1}{2}$, 1, $\frac{3}{2}$ . . . , the light extraction efficiency is reduced.

Therefore, in the case where the light-emitting region is placed in the vicinity of an interface between the light-emitting layer 222 and the hole transporting layer 223 in the light-emitting element of this embodiment mode, the thicknesses of the first layer 211, the second layer 212, the electron transporting layer 221 and the light-emitting layer 222 are each preferably adjusted so as to satisfy the following expression 4. Accordingly, light can be emitted to the outside efficiently. Also, the increase in resistance value with the increase of film thicknesses of $d_i$ and $d_{ii}$ can be suppressed. Here the resistance value indicates a value obtained by dividing an applied voltage (V) by a current (mA) flowing through a light-emitting element in accordance with the applied voltage.

$$n_i d_i + n_{ii} d_{ii} + n_1 d_1 + n_p d_p = \frac{(2m-1)\lambda}{4} \qquad 4$$

In the expression 4, $n_i$ represents the refractive index of the first layer 211; $d_i$, the thickness of the first layer 211; $n_{ii}$, the refractive index of the second layer 212; $d_{ii}$, the thickness of the second layer 212; $n_1$, the refractive index of the electron transporting layer 221; $d_1$, the thickness of the electron transporting layer 221; $n_p$, the refractive index of the light-emitting layer 222; $d_p$, the thickness of the light-emitting layer 222; $\lambda$, the wavelength of light emitted from the light-emitting element; and m, a given positive integer.

Meanwhile, in the case where the light-emitting region is placed in the vicinity of an interface between the light-emitting layer 222 and the electron transporting layer 221 in the light-emitting element of this embodiment mode, the thicknesses of the first layer 211, the second layer 212 and the electron transporting layer 221 are preferably adjusted so as to satisfy the expression 5. Accordingly, light can be emitted to the outside efficiently. In addition, the increase in the resistance value with the increase in film thicknesses of $d_i$ and $d_{ii}$ can be suppressed.

$$n_i d_i + n_{ii} d_{ii} + n_1 d_1 = \frac{(2m-1)\lambda}{4} \qquad 5$$

In the expression 5, $n_i$ represents the refractive index of the first layer 211; $d_i$, the thickness of the first layer 211; $n_{ii}$, the refractive index of the second layer 212; $d_{ii}$, the thickness of the second layer 212; $n_1$, the refractive index of the electron transporting layer 221; $d_1$, the thickness of the electron transporting layer 221; $\lambda$, the wavelength of light emitted from the light-emitting element; and m, a given positive integer.

Further, when the light-emitting region is formed in the entire area of the light-emitting layer 222 in the light-emitting element of this embodiment mode, the thicknesses of the first layer 211, the second layer 212 and the electron transporting layer 221 are preferably adjusted so as to satisfy the following expression 6. Accordingly, light can be emitted to the outside efficiently.

$$\frac{(2m-1)\lambda}{4} - n_{ii}d_{ii} - n_1 d_1 - n_p d_p \leq n_i d_i \leq \frac{(2m-1)\lambda}{4} - n_{ii} d_{ii} - n_1 d_1 \qquad 6$$

In the expression 6, $n_i$ represents the refractive index of the first layer 211; $d_i$, the thickness of the first layer 211; $n_{ii}$, the refractive index of the second layer 212; $d_{ii}$, the thickness of the second layer 212; $n_1$, the refractive index of the electron transporting layer 221; $d_1$, the thickness of the electron transporting layer 221; $n_p$, the refractive index of the light-emitting layer 222; $d_p$, the thickness of the light-emitting layer 222; $\lambda$, the wavelength of light emitted from the light-emitting element; and m, a given positive integer.

In the expressions 4, 5 and 6, m is preferably a value in the range of 1 to 10 ($1 \leq m \leq 10$). Concretely, the light emitted from the light-emitting element indicates light which is generated by the light-emitting substance and is emitted to the outside of the light-emitting element. Also, the wavelength of light emission indicates a theoretical figure with respect to a wavelength showing a maximal value in emission spectrum.

When the first layer 211 is formed using an aromatic amine compound and the second layer 212 is formed using a substance of which the electron mobility is higher than the hole mobility, in particular, $d_{ii}$ is preferably equal to or greater than $d_i$ ($d_i \geq d_{ii}$) in the above-mentioned expressions 4, 5 and 6. Accordingly, the increase in the resistance value with the increase in film thickness can be further suppressed. This is because a larger number of aromatic amine compounds which transport holes rather than electrons exist, and the aromatic amine compound that has higher hole mobility is easilier obtained as compared with an aromatic amine compound that has the higher electron mobility. Therefore, the light-emitting element of the present invention can utilize the aromatic amine compound effectively. By utilizing the aromatic amine compound effectively, the range of choices for materials that are used for forming a light-emitting element is widened, and hence, the light-emitting element can be manufactured easily.

The light-emitting element having the structure in which the electron transporting layer 221 is interposed between the second layer 212 and the light-emitting layer 222 has been explained in this embodiment mode. Alternatively, the light-emitting element may include a different layer between the second layer 212 and the light-emitting layer 222, instead of the electron transporting layer 221. In this case, $n_1 d_1$ in the expression 6 can be expressed as follows: $n_1 d_1 + n_2 d_2 \ldots + n_k d_k + \ldots$.

Embodiment Mode 3

The light-emitting element of the present invention is a highly reliable element having less increase in the driving voltage with the accumulation of light-emission time. Thus, by applying a light-emitting element of the present invention to, e.g., a pixel portion, a light-emitting device having lower power consumption can be obtained. Also, the light-emitting element of the present invention can prevent a short circuit between electrodes easily. Therefore, by applying a light-emitting element of the present invention to a pixel portion, a light-emitting device capable of displaying favorable images having less defects due to a short circuit can be obtained. Furthermore, the light-emitting element of the present invention can easily increase extraction efficiency of light. By applying a light-emitting element of the present invention to a pixel portion, a. light-emitting device capable of performing display operation at low power consumption can be obtained.

In this embodiment mode, circuit structures and driving methods of a light-emitting device having a display function will be described with reference to FIGS. 3 to 6.

Figure 3:
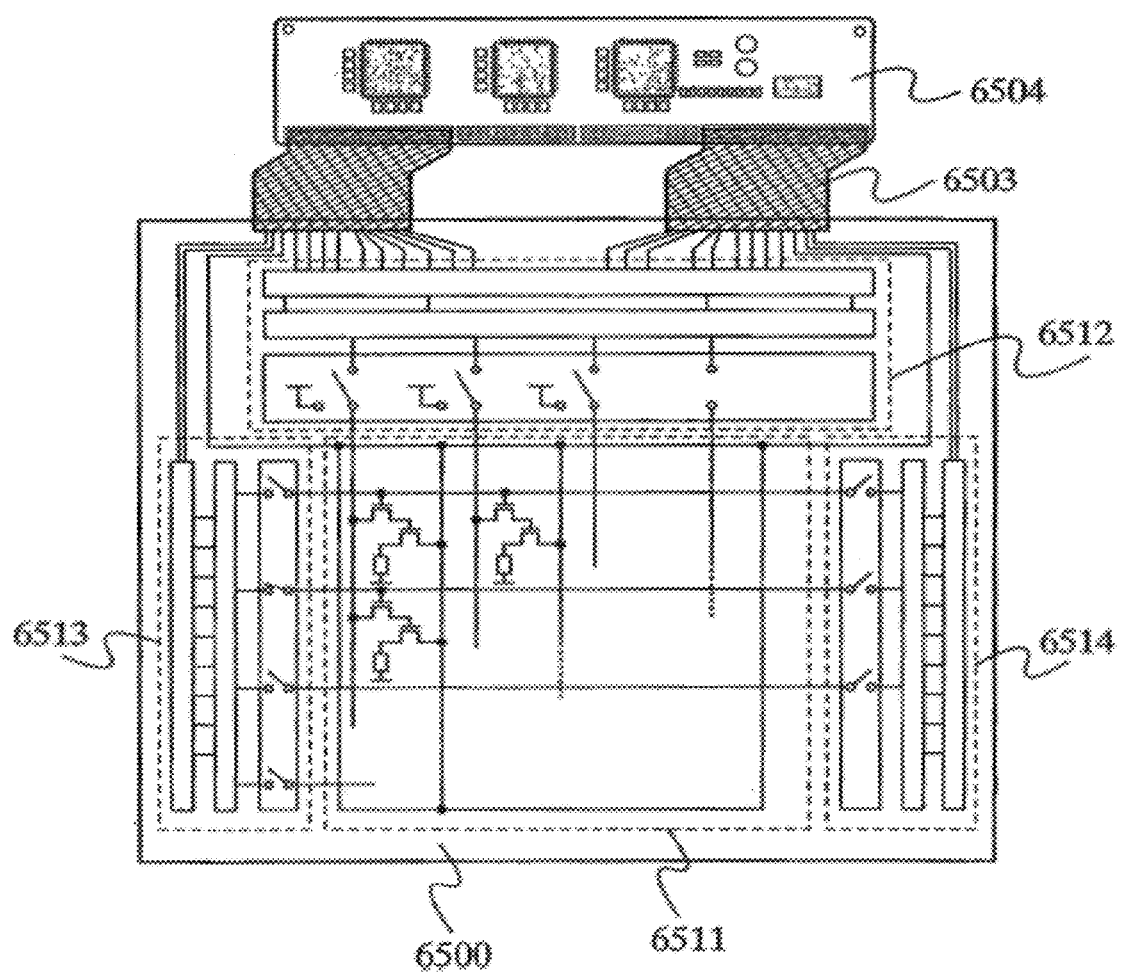
FIG. 3 shows one mode of a light-emitting device to which the present invention is applied.

FIG. 3 is a schematic top view of a light-emitting device to which the present invention is applied. In FIG. 3, a pixel portion 6511, a source signal line driver circuit 6512, a writing gate signal line driver circuit 6513 and an erasing gate signal line driver circuit 6514 are formed over a substrate 6500. The source signal line driver circuit 6512, the writing gate signal line driver circuit 6513 and the erasing gate signal line driver circuit 6514 are each connected to FPCs (flexible printed circuits) 6503, which are external input terminals, through wiring groups. The source signal line driver circuit 6512, the writing gate signal line driver circuit 6513 and the erasing gate signal line driver circuit 6514 receive video signals, clock signals, start signals, reset signals and the like from the FPCs 6503. Printed wiring boards (PWBs) 6504 are attached to the FPCs 6503. Further, each of the driver circuits is not necessary to be formed over the same substrate as the pixel portion 6511. For example, the driver circuits may be provided outside of the substrate by utilizing TCP in which an IC chip is mounted on an FPC having a wiring pattern, or the like.

A plurality of source signal lines extending in columns are aligned in rows in the pixel portion 6511. Also, power supply lines are aligned in rows. A plurality of gate signal lines extending in rows are aligned in columns in the pixel portion 6511. In addition, a plurality of circuits each including a light-emitting element are aligned in the pixel portion 6511.

Figure 4:
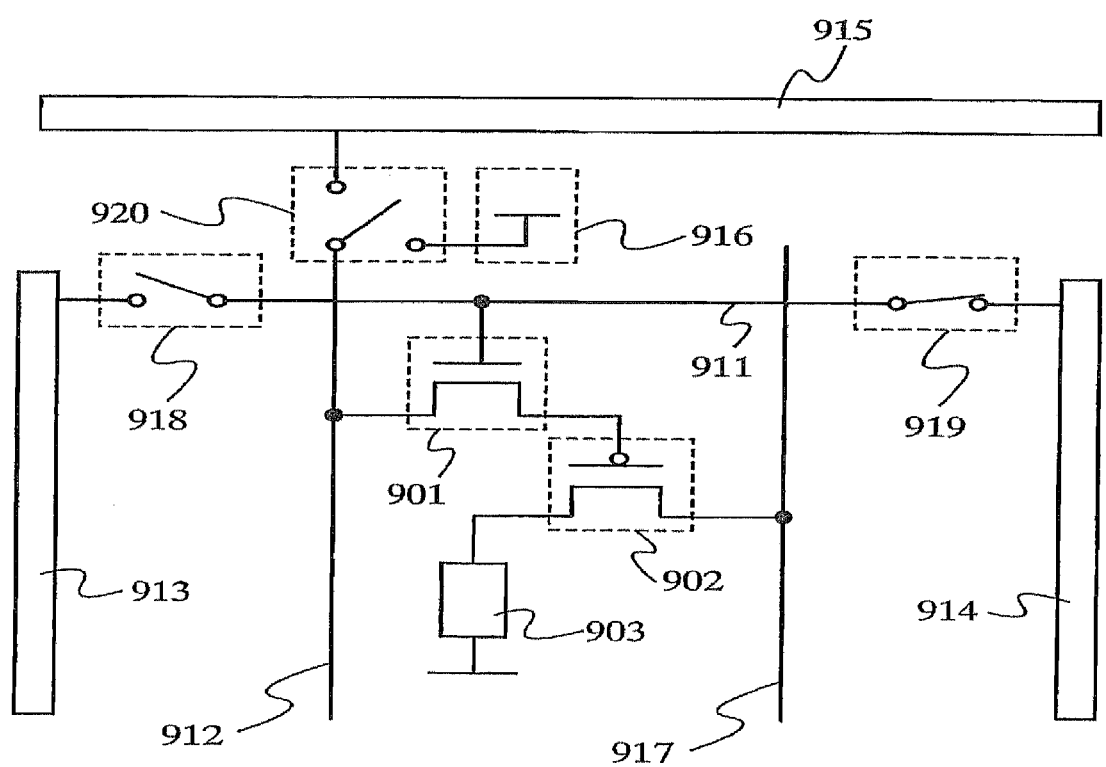
FIG. 4 is a diagram explaining one mode of a circuit included in a light-emitting device to which the present invention is applied.

FIG. 4 is a diagram showing a circuit for operating one pixel. The circuit shown in FIG. 4 comprises a first transistor 901, a second transistor 902 and a light-emitting element 903.

Each of the first and second transistors 901 and 902 is a three terminal element including a gate electrode, a drain region and a source region. A channel region is interposed between the drain region and the source region. The region serving as the source region and the region serving as the drain region are exchanged depending on a structure, an operational condition and the like of a transistor, and therefore, it is difficult to determine which region serves as the source region or the drain region. Accordingly, the regions serving as the source and the drain are each denoted as a first electrode and a second electrode of each transistor in this embodiment mode.

A gate signal line 911 and a writing gate signal line driver circuit 913 are provided to be electrically connected or disconnected to each other by a switch 918. The gate signal line 911 and an erasing gate signal line driver circuit 914 are provided to be electrically connected or disconnected to each other by a switch 919. A source signal line 912 is provided to be electrically connected to either a source signal line driver circuit 915 or a power source 916 by a switch 920. A gate of the first transistor 901 is electrically connected to the gate signal line 911. The first electrode of the first transistor 901 is electrically connected to the source signal line 912 while the second electrode thereof is electrically connected to a gate electrode of the second transistor 902. The first electrode of the second transistor 902 is electrically connected to a current supply line 917 while the second electrode thereof is electrically connected to an electrode included in a light-emitting element 903. Further, the switch 918 may be included in the writing gate signal line driver circuit 913. The switch 919 may also be included in the erasing gate signal line driver circuit 914. In addition, the switch 920 may be included in the source signal line driver circuit 915.

Figure 5:
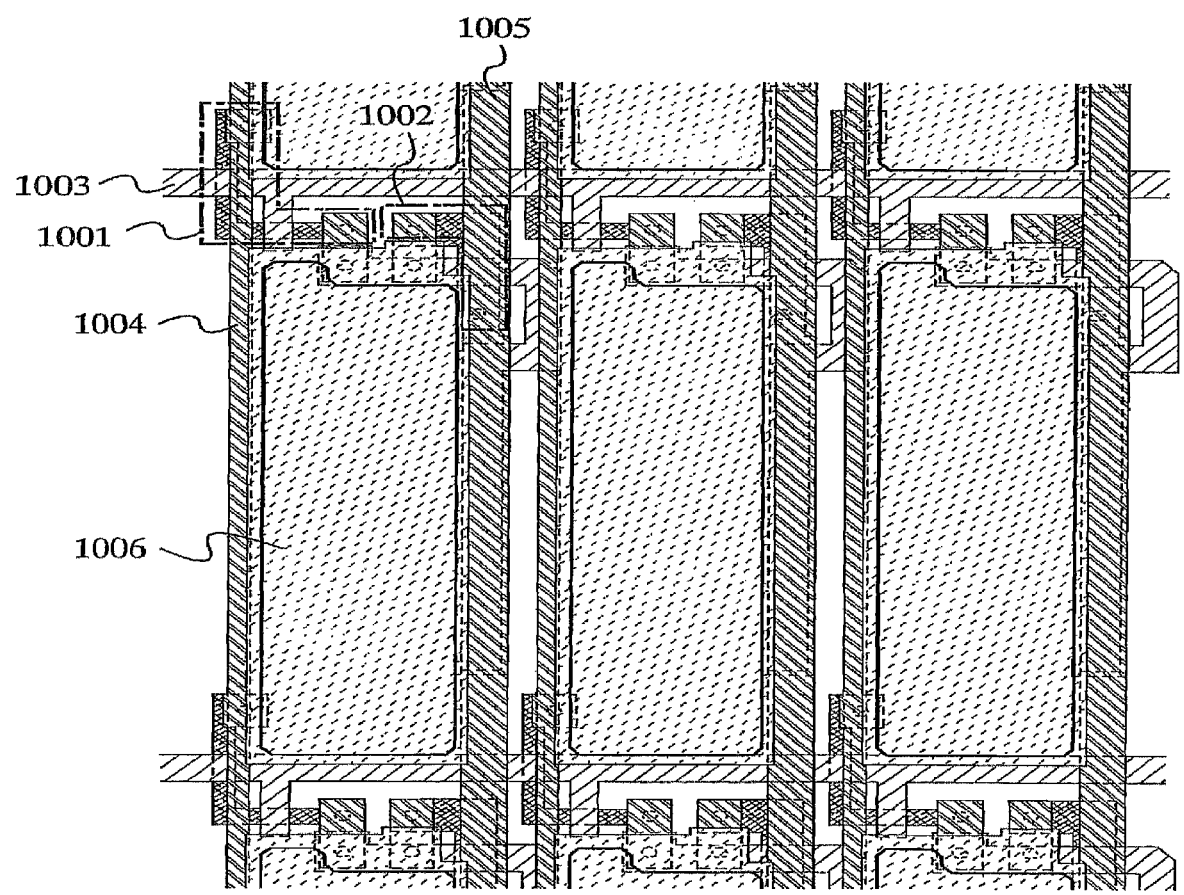
FIG. 5 is a top view of a light-emitting device to which the present invention is applied.

The arrangement of transistors, light-emitting elements and the like in the pixel portion is not especially limited. For example, the arrangement as shown in a top view of FIG. 5 can be employed. In FIG. 5, a first electrode of a first transistor 1001 is connected to a source signal line 1004 while a second electrode of the first transistor is connected to a gate electrode of a second transistor 1002. A first electrode of the second transistor 1002 is connected to a current supply line 1005 and a second electrode of the second transistor is connected to an electrode 1006 of a light-emitting element. A part of the gate signal line 1003 functions as a gate electrode of the first transistor 1001.

Figure 6:
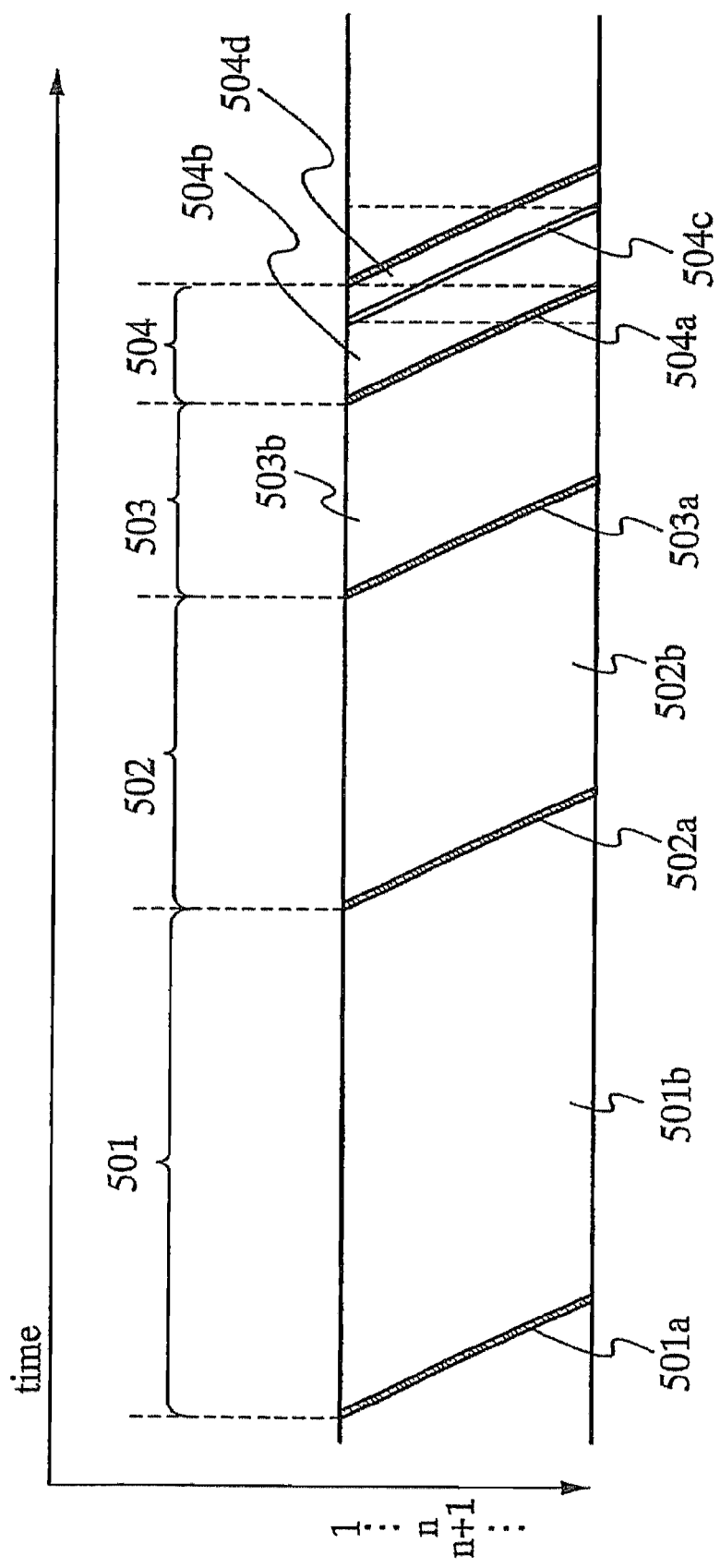
FIG. 6 is a diagram explaining one mode of a frame operation of a light-emitting device to which the present invention is applied.

Next, a driving method will be described below. FIG. 6 is a diagram explaining an operation of a frame with time. In FIG. 6, a horizontal direction indicates time passage while a vertical direction indicates the number of scanning stages of a gate signal line.

When an image is displayed with a light-emitting device to which the present invention is applied, a rewriting operation and a displaying operation for the image are repeatedly carried out in a display period. The number of rewriting operations is not especially limited; however, the rewriting operation is preferably performed approximately sixty times per second so that a person who watches the image does not find flickering. Herein, the period when the operations of rewriting and displaying of one image (one frame) are carried out is referred to as one frame period.

One frame period is time-divided into four sub frame periods 501, 502, 503, and 504 including write periods 501a, 502a, 503a, and 504a, and retention periods 501b, 502b, 503b, and 504b as shown in FIG. 6. A light-emitting element that receives a light-emission signal emits light in the retention period. The length ratio of the retention periods in the first sub frame period 501, the second sub frame period 502, the third sub frame period 503, and the fourth sub frame period 504 is $2^3:2^2:2^1:2^0=8:4:2:1$. Accordingly, a 4-bit gray scale can be realized. The number of bits or gray scale levels is not limited thereto. For instance, an 8-bit gray scale can be offered by providing eight sub frame periods.

An operation in one frame period is explained. Firstly, a writing operation is carried out from the first row to the last row sequentially in the sub frame period 501. Therefore, the starting time of a write period is different depending on the rows. The retention period 501b starts in the row where the write period 501a is completed. In the retention period, a light-emitting element that receives a light-emission signal emits light. The sub frame period 502 starts in the row where the retention period 501b is completed, and a writing operation is carried out from the first row to the last row sequentially as is the case with the sub frame period 501. Operations as noted above are repeatedly carried out to finish the retention period 504b of the sub frame period 504. When an operation in the sub frame period 504 is finished, an operation in the next frame period is started. The sum of light-emission time in each of the sub frame periods is a light-emission time of each light-emitting element in one frame period. By varying the light-emission time depending on each light-emitting element to be variously combined in one pixel, various colors can be displayed with different brightness and chromaticity.

As in the sub frame 504, when a retention period in the row where writing has been finished and the retention period has started is intended to be forcibly terminated before finishing the writing of the last row, an erase period 504c is preferably provided after the retention period 504b to forcibly stop the light-emission. The row where the light-emission is forcibly stopped does not emit light during a fixed period (this period is referred to as a non-light emission period 504d). Upon finishing the write period of the last row, a write period of the next sub frame (or a frame period) starts from the first row. This makes it possible to prevent the write period of the sub frame 504 from overlapping a write period of the next sub frame period.

In this embodiment mode, the sub frame periods 501 to 504 are arranged in order from the longest retention period; however, the present invention is not limited thereto. For instance, the sub frame periods 501 to 504 may be arranged in order from the shortest retention period. The sub frame periods 501 to 504 may be arranged at random combining short sub frame periods and long sub frame periods. The sub frame period may be further divided into a plurality of frame periods. That is, scanning of the gate signal line may be carried out a plurality of times during the period of giving the same video signal.

An operation in a write period and an erase period of a circuit shown in FIG. 4 is explained.

First, an operation in the write period is explained. In the write period, the gate signal line 911 in the n-th row (n is a natural number) is electrically connected to the writing gate signal line driver circuit 913 via the switch 918. The gate signal line 911 is not connected to the erasing gate signal line driver circuit 914. The source signal line 912 is electrically connected to the source signal line driver circuit 915 via the switch 920. A signal is inputted to the gate of the first transistor 901 connected to the gate signal line 911 in the n-th row, and thus, the first transistor 901 is turned ON. At this time, video signals are simultaneously inputted to the source signal lines in the first column to the last column. Video signals inputted from the source signal line 912 at each column are independent from each other. The video signal inputted from the source signal line 912 is inputted to the gate electrode of the second transistor 902 via the first transistor 901 connected to each source signal line. At this time, the signal inputted to the second transistor 902 determines emission or non-emission of the light-emitting element 903. For example, in the case that the second transistor 902 is a p-channel type, the light-emitting element 903 emits light when a Low Level signal is inputted to the gate electrode of the second transistor 902. On the other hand, in the case that the second transistor 902 is an n-channel type, the light-emitting element 903 emits light when a High Level signal is inputted to the gate electrode of the second transistor 902.

Then, an operation in the erase period is explained. In the erase period, the gate signal line 911 of the n-th row (n is a natural number) is electrically connected to the erasing gate signal line driver circuit 914 via the switch 919. The gate signal line 911 is not electrically connected to the writing gate signal line driver circuit 913. The source signal line 912 is electrically connected to the power source 916 via the switch 920. A signal is inputted to the gate of the first transistor 901 connected to the gate signal line 911 in the n-th row, and thus, the first transistor 901 is turned ON. At this time, erase signals are simultaneously inputted to the source signal lines in the first column to the last column. The erase signal inputted from the source signal line 912 is inputted to the gate electrode of the second transistor 902 via the first transistor 901 connected to each source signal line. By the signal inputted to the second transistor 902, current supply from the current supply line 917 to the light-emitting element 903 is stopped. The light-emitting element 903 does not emit light forcibly. For example, in the case that the second transistor 902 is a p-channel type, the light-emitting element 903 does not emit light when a High Level signal is inputted to the gate electrode of the second transistor 902. On the other hand, in the case that the second transistor 902 is an n-channel type, the light-emitting element 903 does not emit light when a Low Level signal is inputted to the gate electrode of the second transistor 902.

In the erase period, a signal for erasing is inputted to the n-th (n is a natural number) row by the operation as described above. However, there is a case that the n-th row is in an erase period and another row (m-th row, m is a natural number) is in a write period. In this instance, it is required that a signal for erasing is inputted to the n-th row and a signal for writing is inputted to the m-th row by utilizing a source signal line of the same column. Accordingly, an operation explained as follows is preferably carried out.

Immediately after the light-emitting element 903 in the n-th row is brought into a non emission state by the operation in the erase state described above, the gate signal line 911 is disconnected from the erasing gate signal line driver circuit 914, and the source signal line 912 is connected to the source signal line driver circuit 915 by changing the switch 920. As well as connecting the source signal line 912 to the source signal line driver circuit 915, the gate signal line 911 is connected to the writing gate signal line driver circuit 913. A signal is selectively inputted to the signal line in the m-th row from the writing gate signal line driver circuit 913, and when the first transistor is turned ON, signals for writing are inputted to the source signal lines in the first column to the last column from the source signal line driver circuit 915. The light-emitting element in the m-th row emits light or no light depending on the signal.

Immediately after finishing the write period of the m-th row as noted above, an erase period in the (n+1)-th row starts. For this, the gate signal line 911 and the writing gate signal line driver circuit 913 are disconnected, and the source signal line 912 and the power source 916 are connected by changing the switch 920. Further, the gate signal line 911 and the writing gate signal line driver circuit 913 are disconnected, and the gate signal line 911 is connected to the erasing gate signal line driver circuit 914. When a signal is selectively inputted to the gate signal line in the (n+1)-th row from the erasing gate signal line driver circuit 914, and the first transistor is turned ON, an erase signal is inputted from the power source 916. Immediately after finishing the erase period in the (n+1)-th row, a write period in the (m+1)-th row starts. Hereinafter, an erase period and a write period may be carried out repeatedly to operate to complete an erase period of the last row.

In this embodiment mode, a mode in which the write period in the m-th row is provided between the erase period of the n-th row and the erase period of the (n+1)-th row is explained. Without being limited to this, however, the write period of the m-th row may be provided between the erase period of (n−1)-th row and the erase period of the n-th row.

In this embodiment mode, when providing the non-light emission period 504*d* as in the sub frame period 504, an operation of electrically disconnecting the erasing gate signal line driver circuit 914 from a certain gate signal line and electrically connecting the writing gate signal line driver circuit 913 to another gate signal line is repeatedly carried out. Such an operation may be carried out in a frame period which does not includes a non-light emission period.

Embodiment Mode 4

An example of a cross sectional view of a light-emitting device including a light-emitting element of the present invention will be described with reference to FIGS. 7A to 7C.

In each of FIGS. 7A to 7C, a region surrounded by a dashed line represents a transistor 11 which is provided for driving a light-emitting element 12 of the present invention. The light-emitting element 12 of the present invention comprises a layer 15 in which a layer generating holes, a layer generating electrons and a layer including a light-emitting substance are stacked between a first electrode 13 and a second electrode 14. A drain of the transistor 11 and the first electrode 13 are electrically connected to each other by a wiring 17 which passes through a first interlayer insulating film 16 (16*a*, 16*b* and 16*c*). The light-emitting element 12 is isolated from other light-emitting elements provided adjacently to the light-emitting element 12 by a partition layer 18. The light-emitting device of the present invention having this structure is provided over a substrate 10 in this embodiment mode.

The transistor 11 as shown in each of FIGS. 7A to 7C is a top-gate type transistor in which a gate electrode is provided on a side of a semiconductor layer opposite to the substrate. Further, the structure of the transistor 11 is not especially limited. For example, a bottom-gate type transistor may be employed. In the case of using a bottom-gate type transistor, either a transistor in which a protection film is formed on a semiconductor layer forming a channel (a channel protection type transistor) or a transistor in which a part of a semiconductor layer forming a channel is etched (a channel etched type transistor) may be used. Reference numeral 21 denotes a gate electrode, 22; a gate insulating film, 23; a semiconductor layer, 24; an n-type semiconductor layer, 25; an electrode; and 26; a protective film.

The semiconductor layer constituting a part of the transistor 11 may be any of a crystalline semiconductor, a non-crystalline semiconductor, a semiamorphous semiconductor, and the like.

Concretely, the semiamorphous semiconductor has an intermediate structure between an amorphous structure and a crystalline structure (including a single crystalline structure and a polycrystalline structure), and a third condition that is stable in term of free energy. The semiamorphous semiconductor further includes a crystalline region having a short range order along with lattice distortion. A crystal grain with a size of 0.5 to 20 nm is included in at least a part of an semiamorphous Raman spectrum is shifted toward a lower wavenumber than 520 cm$^{-1}$. The diffraction peaks of (111) and (220), which are believed to be derived from Si crystal lattice, are observed in the semiamorphous semiconductor by the X-ray diffraction. The semiamorphous semiconductor contains hydrogen or halogen of 1 atom % or more for terminating dangling bonds. The semiamorphous semiconductor is also referred to as a microcrystalline semiconductor. The semiamorphous semiconductor is formed by glow discharge decomposition of a silicon source gas (plasma CVD). As for the silicon source gas, $SiH_4$, $Si_2H_6$, $SiH_2Cl_2$, $SiHCl_3$, $SiCl_4$, $SiF_4$ and the like can be used. The silicon source gas may also be diluted with $H_2$, or a mixture of $H_2$ and one or more of rare gas elements selected from the group consisting of He, Ar, Kr and Ne. The dilution ratio is set to be in the range of 1:2 to 1:1,000. The pressure is set to be approximately in the range of 0.1 to 133 Pa. The power frequency is set to be 1 to 120 MHz, preferably, 13 to 60 MHz. The substrate heating temperature may be set to be 300° C. or less, more preferably, 100 to 250° C. As to impurity elements contained in the film, each concentration of impurities for atmospheric constituents such as oxygen, nitrogen and carbon is preferably set to be $1\times10^{20}$/cm$^3$ or less. In particular, the oxygen concentration is set to be $5\times10^{19}$/cm$^3$ or less, preferably, $1\times10^{19}$/cm$^3$ or less. The mobility of a thin film transistor (TFT) formed using a semi-amorphous semiconductor is about 1 to 10 m$^2$/Vsec.

As a specific example of a crystalline semiconductor layer, a semiconductor layer made from single crystalline silicon, polycrystalline silicon, silicon germanium, or the like can be cited. These materials may be formed by laser crystallization. For example, these materials may be formed by crystallization with use of a solid phase growth method using nickel or the like.

When a semiconductor layer is formed with an amorphous substance, e.g., amorphous silicon, it is preferable to use a light-emitting device with a circuit including only n-channel transistors as the transistor 11 and another transistor (a transistor included in a circuit for driving a light-emitting element). Alternatively, a light-emitting device with a circuit including either an n-channel transistor or a p-channel transistor may be employed. Also, a light-emitting device with a circuit including both an n-channel transistor and a p-channel transistor may be used.

The first interlayer insulating film 16 may include plural layers (e.g., interlayer insulating films 16a, 16b and 16c) as shown in FIGS. 7A to 7C or a single layer. The interlayer insulating film 16a is made from an inorganic material such as silicon oxide and silicon nitride. The interlayer insulating film 16b is made with acrylic or siloxane (which is a compound that has a skeleton formed by a silicon (Si)-oxygen (O) bond and includes a hydrogen or an organic group such as an alkyl group as its substituent), or a substance with a self-planarizing property which can be formed by a coating method, such as silicon oxide. The interlayer insulating film 16c is made with a silicon nitride film containing argon (Ar). The substances constituting each layer are not especially limited. Therefore, substances other than the above-mentioned substances may be employed. Alternatively, a layer made with a substance other than the above-mentioned substances may be used in combination. Accordingly, the first interlayer insulating film 16 may be formed using both an inorganic material and an organic material or using either an inorganic material or an organic material.

The edge portion of the partition layer 18 preferably has a shape in which the radius of curvature is continuously varied. This partition layer 18 is formed using acrylic, siloxane, resist, silicon oxide, or the like. Further, the partition layer 18 may be made with one of or both an inorganic film and an organic film.

FIGS. 7A and 7C each show a structure in which only the first interlayer insulating film 16 (including the first interlayer insulating films 16a to 16c) is sandwiched between the transistor 11 and the light-emitting element 12. Alternatively, as shown in FIG. 7B, in addition to the first interlayer insulating film 16 (16a and 16b), a second interlayer insulting film 19 (19a and 19b) may be provided between the transistor 11 and the light-emitting element 12. In the light-emitting device as shown in FIG. 7B, the first electrode 13 passes through the second interlayer insulating film 19 to be connected to the wiring 17.

The second interlayer insulating film 19 may include either plural layers or a single layer, as well as the first interlayer insulating film 16. The interlayer insulating film 19a is made with acrylic, siloxane, or a substance with a self-planarizing property which can be formed by a coating method, such as silicon oxide. The interlayer insulating film 19b is made with a silicon nitride film containing argon (Ar). The substances constituting each layer are not especially limited. Therefore, substances other than the above-mentioned substances may be employed. Alternatively, a layer made with a substance other than the above-mentioned substances may be used in combination. Accordingly, the second interlayer insulating film 19 may be formed using both an inorganic material and an organic material or using either an inorganic material or an organic material.

When the first electrode and the second electrode each are formed using a substance with a light-transmitting property in the light-emitting element 12, light can be emitted through both the first electrode 13 and the second electrode 14 as shown in the outline arrows in FIG. 7A. When only the second electrode 14 is made with a substance with a light-transmitting property, light can be emitted only through the second electrode 14 as shown in the outline arrow of FIG. 7B. In this case, the first electrode 13 is preferably made with a material with high reflectance or a film (reflective film) made with a material with high reflectance is preferably provided under the first electrode 13. When only the first electrode 13 is made with a substance with a light-transmitting property, light can be emitted only through the first electrode 13 as shown in the outline arrow of FIG. 7C. In this case, the second electrode 14 is preferably made using a material with high reflectance or a reflective film is preferably provided over the second electrode 14.

Moreover, the light-emitting element 12 may be a light-emitting element which formed by stacking the layer 15, so that the light-emitting element can operate in applying voltage thereto such that a potential of the second electrode 14 is higher than that of the first electrode 13. Alternatively, the light-emitting element 12 may be a light-emitting element which formed by stacking the layer 15, so that the light-emitting element can operate in applying voltage thereto such that a potential of the second electrode 14 is lower than that of the first electrode 13. In the former case, the transistor 11 is an n-channel transistor. In the latter case, the transistor 11 is a p-channel transistor.

Figure 30:
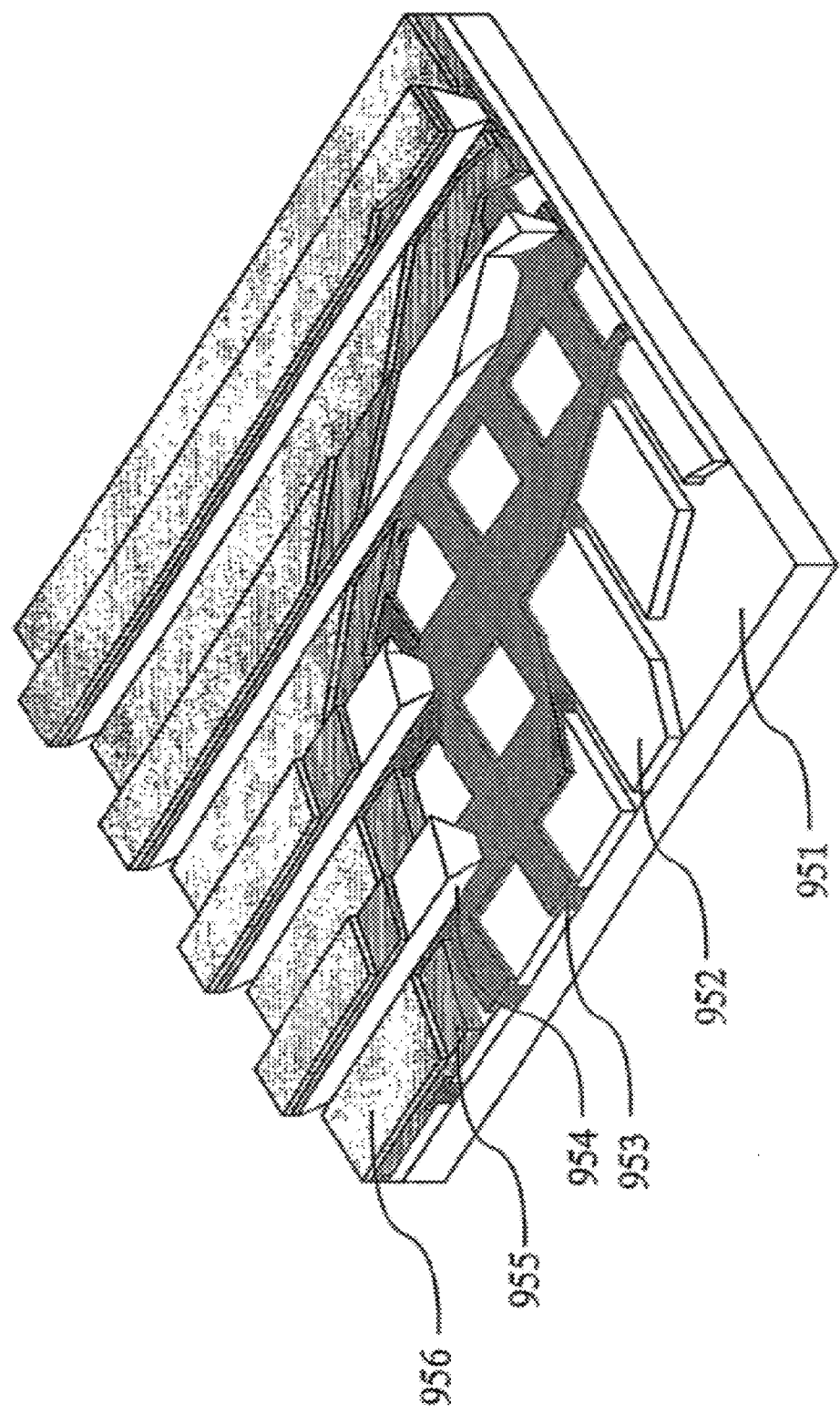
FIG. 30 is a perspective view of a light-emitting device to which the present invention is applied.

As set forth above, an active light-emitting device which controls the driving of the light-emitting element using a transistor has been described in this embodiment mode. In addition, a passive light-emitting device which drives a light-emitting element without providing a driving element such as a transistor may be employed. FIG. 30 shows a perspective view of a passive light-emitting device which is manufactured in accordance with the present invention. In FIG. 30, a layer 955 in which a layer containing a light emitting substance, a layer generating electrons and a layer generating holes are sequentially stacked is provided between an electrode 952 and an electrode 956 over a substrate 951. An edge portion of the electrode 952 is covered with an insulating layer 953. A partition layer 954 is provided over the insulating layer 953. The sidewalls of the partition layer 954 are aslope such that a distance between both sidewalls is gradually narrowed toward the surface of the substrate. That is, a cross section in a short side of the partition layer 954 is a trapezoidal shape, and a lower side (the side is in contact with the insulating layer 953) is shorter than an upper side (the side is not in contact with the insulating layer 953). By providing the partition layer 954 in this manner, defects of the light-emitting element due to static charge and the like can be prevented. In addition, by utilizing the light-emitting element of, the present invention, which operates at low driving voltage, for a passive light-emitting device, the passive light-emitting device can be driven at lower power consumption.

Embodiment Mode 5

By mounting a light-emitting device of the present invention, electronic devices with less increase of power consumption in a display portion or the like can be obtained. Also, by mounting a light-emitting device of the present invention, electronic devices such as display devices capable of displaying favorable images with fewer defects in pixels and the like can be obtained. Furthermore, by mounting the light-emitting device of the present invention, electronic devices having lower power consumption can be obtained.

Figure 8A:
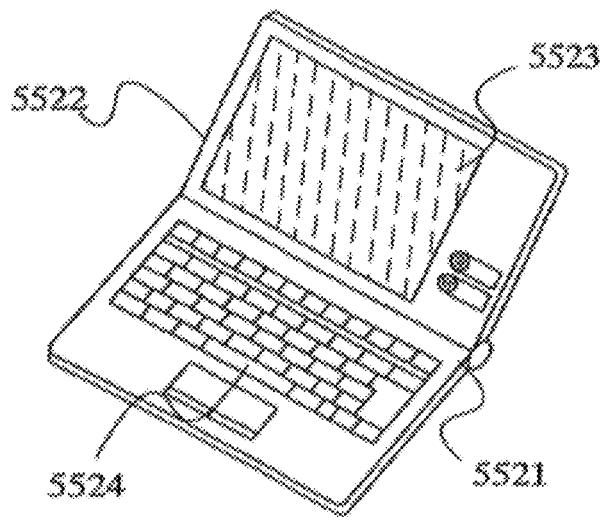
FIGS. 8A to 8C show electronic devices to which the present invention is applied.
Figure 8B:
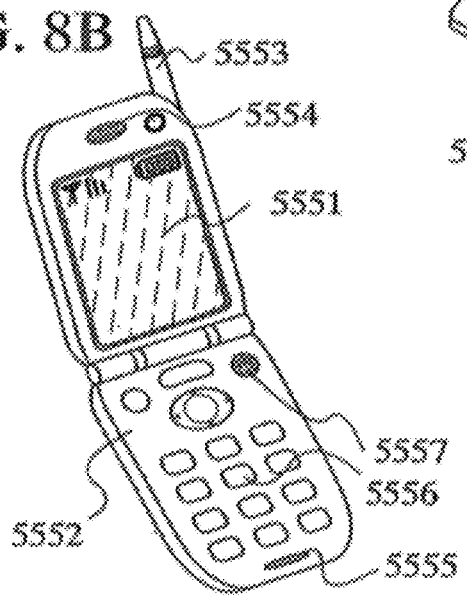
Figure 8C:
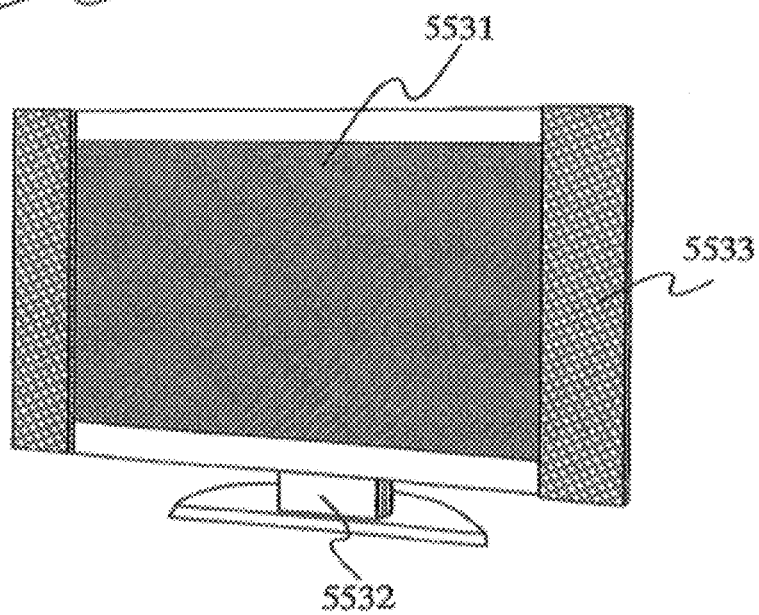

Examples of electronic devices mounting the light-emitting devices to which the present invention is applied are illustrated in FIGS. 8A to 8C.

FIG. 8A is a laptop personal computer manufactured to which the present invention is applied, including a main body 5521, a casing 5522, a display portion 5523, a keyboard 5524 and the like. The laptop personal computer can be completed by incorporating a light-emitting device including a light-emitting element of the present invention in the display portion 5523.

FIG. 8B is a telephone manufactured to which the present invention is applied, including a main body 5552, a display portion 5551, an audio output portion 5554, an audio input portion 5555, operation switches 5556 and 5557, an antenna 5553 and the like. The telephone can be completed by incorporating a light-emitting device including a light-emitting element of the present invention in the display portion 5551.

FIG. 8C is a television set manufactured to which the present invention is applied, including a display portion 5531, a casing 5532, speakers 5533 and the like. The television set can be completed by incorporating a light-emitting device including a light-emitting element of the present invention in the display portion 5531.

As set forth above, the light-emitting devices of the present invention are extremely suitable for the display portions of various kinds of electronic devices.

Further, a light-emitting device having a light-emitting element of the present invention may be mounted on a navigation system, a lighting appliance and the like, in addition to the electronic devices described in this embodiment mode.

Embodiment 1

Figure 2:
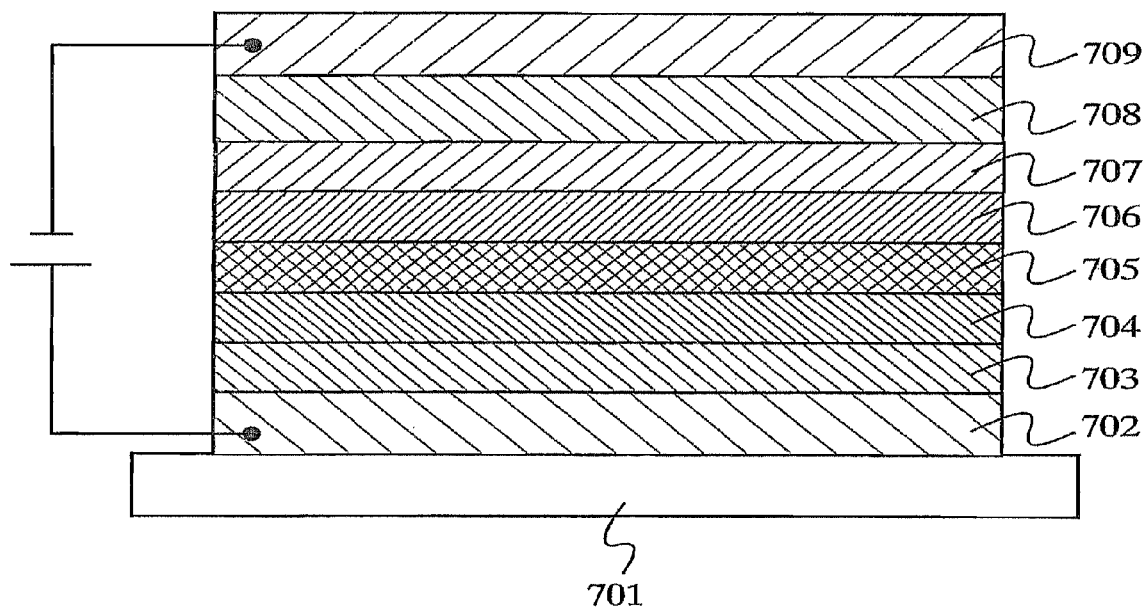
FIG. 2 shows one mode of a stacked structure of a light-emitting element according to the present invention.

Methods for manufacturing four light-emitting elements (i.e., a light-emitting element (1), a light-emitting element (2), a light-emitting element (3) and a light-emitting element (4)) each having a different mixture ratio of an aromatic amine compound to a substance having an electron accepting property with respect to the aromatic amine compound in a layer having a function of generating holes, and characteristics of these elements will be described in this embodiment with reference to FIG. 2.

Indium tin oxide containing silicon was formed over a substrate 701 by sputtering to form a second electrode 702. The second electrode 702 was formed with a thickness of 110 nm. Further, a substrate made of glass was used as the substrate 701.

Next, a layer 703 including molybdenum oxide (VI) was formed on the second electrode 702 by vacuum evaporation of the molybdenum oxide. The layer 703 was formed with a thickness of 5 nm.

Next, a layer 704 including 4,4'-bis[N-(1-naphthyl)-N-phenylamino] biphenyl (NPB or α-NPD) was formed on the layer 703 by vacuum evaporation of the NPB (or α-NPD). The layer 704 was formed to have a thickness of 55 nm.

A layer 705 including tris(8-quinolinolato)aluminum ($Alq_3$) and coumarin 6 was formed on the layer 704 by co-evaporation of the $Alq_3$ and the coumarin 6. The $Alq_3$-coumarin 6 weight ratio was adjusted to satisfy 1:0.005. Accordingly, the coumarin 6 is dispersed in $Alq_3$. The thickness of the layer 705 was set to be 35 nm. Further, the co-evaporation is an evaporation method that is performed simultaneously from plural evaporation sources.

A layer 706 including $Alq_3$ was formed on the layer 705 by vacuum evaporation of the $Alq_3$. The thickness of the layer 706 was set to be 10 nm.

Next, a second layer 707 including $Alq_3$ and lithium (Li) was formed on the layer 706 by co-evaporation of the $Alq_3$ and the lithium. The $Alq_3$-lithium weight ratio was adjusted to satisfy 1:0.01, and the molar ratio ($=Alq_3/Li$) is 1.5. The thickness of the second layer 707 was set to be 10 nm.

Subsequently, a first layer 708 including NPB and molybdenum oxide (VI) was formed on the second layer 707 by co-evaporation of the NPB and the molybdenum oxide. At this moment, with respect to the light-emitting element (1), the molar ratio between the NPB and the molybdenum oxide (=molybdenum oxide/NPB) was adjusted to satisfy 0.5. With respect to the light-emitting element (2), the molar ratio between the NPB and the molybdenum oxide (=molybdenum oxide/NPB) was adjusted to satisfy 1.0. With respect to the light-emitting element (3), the molar ratio between the NPB and the molybdenum oxide (=molybdenum oxide/NPB) was adjusted to satisfy 1.5. With respect to the light-emitting element (4), the molar ratio between the NPB and the molybdenum oxide (=molybdenum oxide/NPB) was adjusted to satisfy 2.0. The thicknesses of the first layers 708 for the respective light-emitting elements were set to be 20 nm.

Next, a first electrode 709 was formed on the first layer 708 by vacuum evaporation of aluminum. The thickness of the first electrode 708 was set to be 100 nm.

When current flows through each light-emitting element manufactured as described above by applying voltage thereto such that a potential of the second electrode 702 is higher than that of the first electrode 709, holes generated in the first layer 708 are injected into the first electrode 709 while electrons generated in the second layer 707 are injected into the layer 706. The holes are injected into the layer 703 from the second electrode 702. The holes injected from the second electrode 702 and the electrons injected from the second layer 707 are recombined in the layer 705, allowing the coumarin 6 to emit light. Accordingly, the layer 705 serves as a light-emitting layer. Further, the layer 703 serves as a hole injecting layer. The layer 704 serves as a hole transporting layer. The layer 706 serves as an electron transporting layer. In each light-emitting element of this embodiment, the substance included in the layer 706 and a substance with an electron transporting property included in the second layer 707 are both $Alq_3$ and the electron affinities of them are equal.

Figure 9:
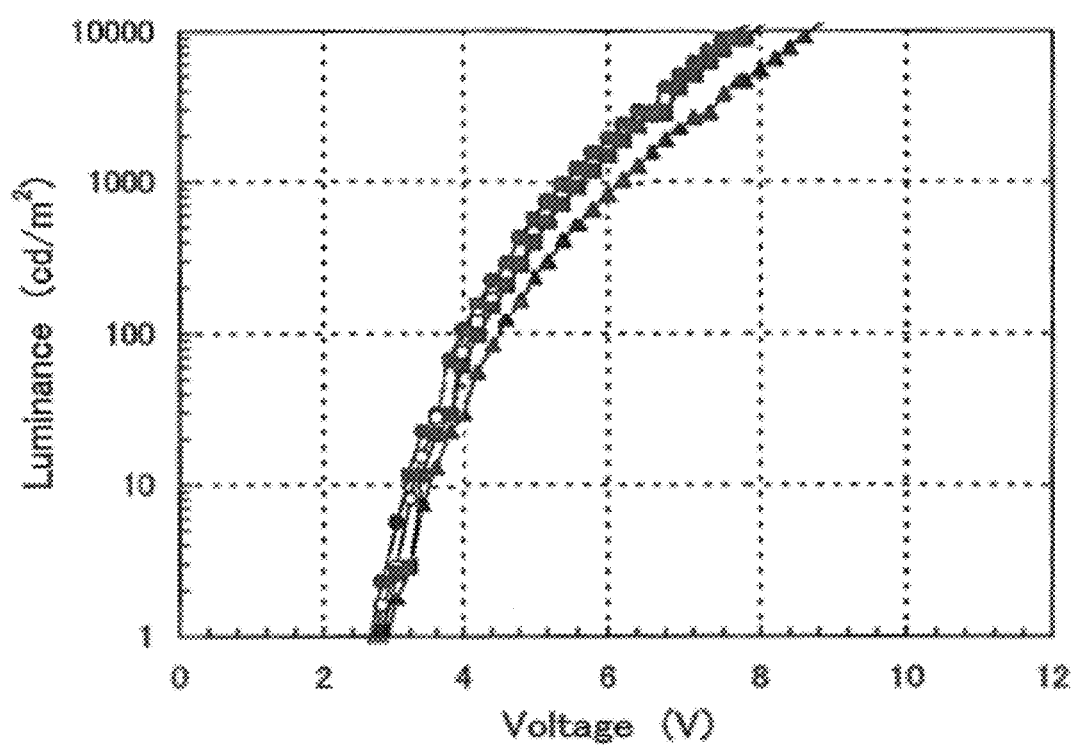
FIG. 9 is a graph showing the voltage-luminance characteristics of a light-emitting element according to the present invention.
Figure 10:
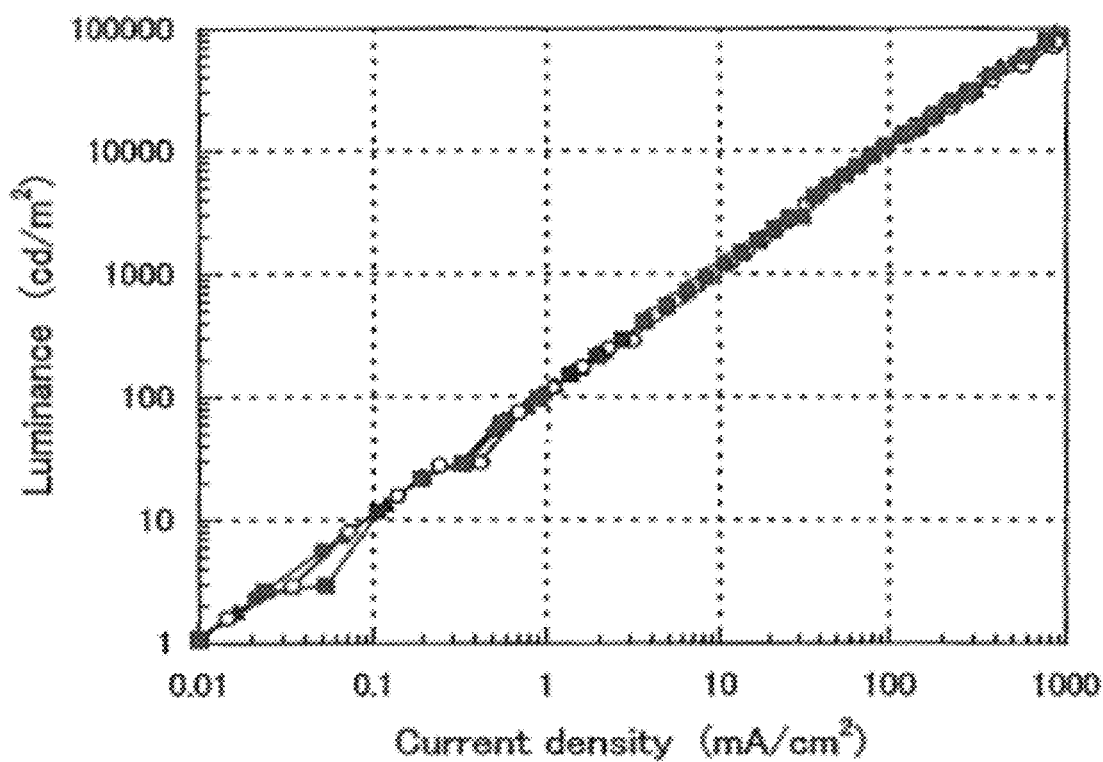
FIG. 10 is a graph showing the current density-luminance characteristics of a light-emitting element according to the present invention.
Figure 11:
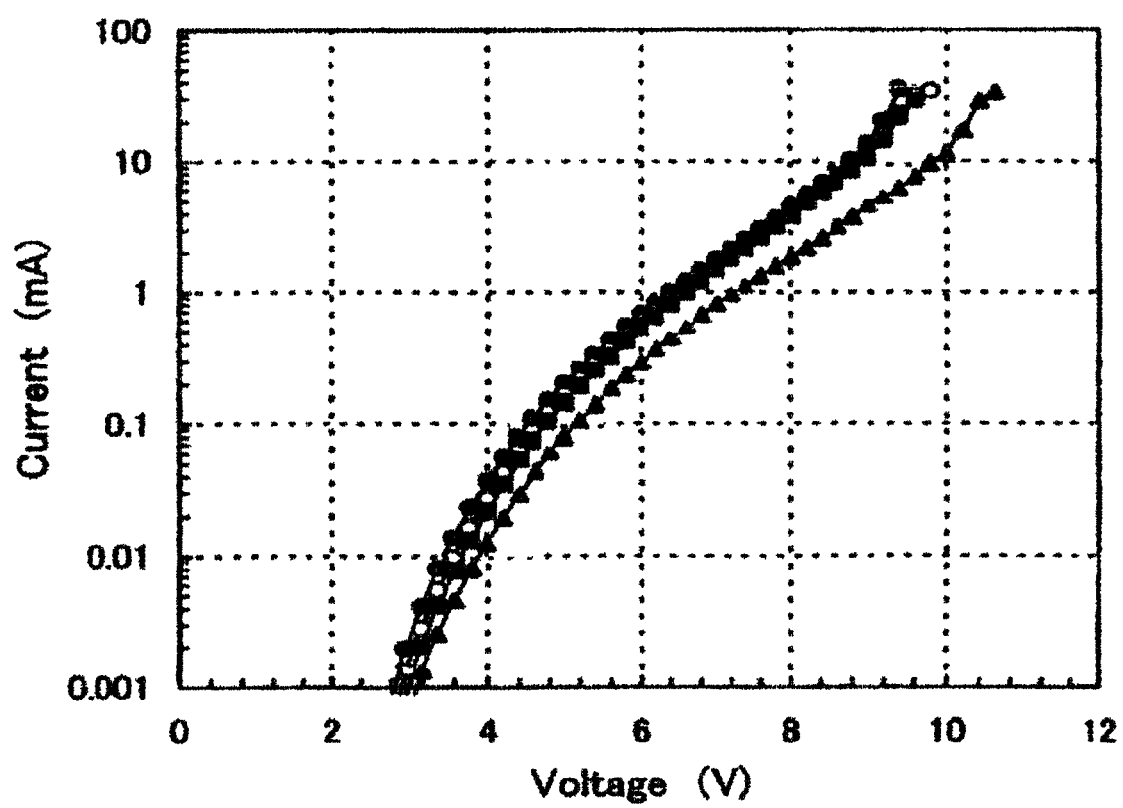
FIG. 11 is a graph showing the voltage-current characteristics of a light-emitting element according to the present invention.

FIG. 9 shows the voltage-luminance characteristics of the light-emitting elements of this embodiment, FIG. 10 shows the current density-luminance characteristics thereof, and FIG. 11 shows the voltage-current characteristics thereof. In FIG. 9, the horizontal axis represents voltage (V) while the vertical axis represents luminance ($cd/m^2$). In FIG. 10, the horizontal axis represents current density ($mA/cm^2$) while the vertical axis represents luminance ($cd/m^2$). In FIG. 11, the horizontal axis represents voltage (V) while the vertical axis represents the current (mA). In FIGS. 9, 10 and 11, a line marked by the symbol ▲ indicates the characteristics of the light-emitting element (1), a line marked by the symbol ● indicates the characteristics of the light-emitting element (2), a line marked by the symbol ○ indicates the characteristics of the light-emitting element (3), and a line marked by the symbol ▨ indicates the characteristics of the light-emitting element (4).

According to FIGS. 9, 10 and 11, it is known that respective light-emitting elements operated favorably. In particular, it is known that the light-emitting elements 2, 3 and 4 have the higher luminance, which is obtained by applying a predetermined voltage to the light-emitting elements, and the larger amount of current, wherein the molar ratios between the NPB and the molybdenum oxide (i.e., NPB/molybdenum oxide) of the respective first layers 708 satisfy 1 to 2. Accordingly, by adjusting the molar ratio between the NPB and the molybdenum oxide (i.e., NPB/molybdenum oxide) to 1 to 2, a light-emitting element capable of operating at low driving voltage can be obtained.

Next, results of carrying out a continuous lighting test to the light-emitting elements of this embodiment will be described. The continuous lighting test was performed as shown below at a normal temperature after sealing the above-manufactured light-emitting elements under nitrogen atmosphere.

Figure 12:
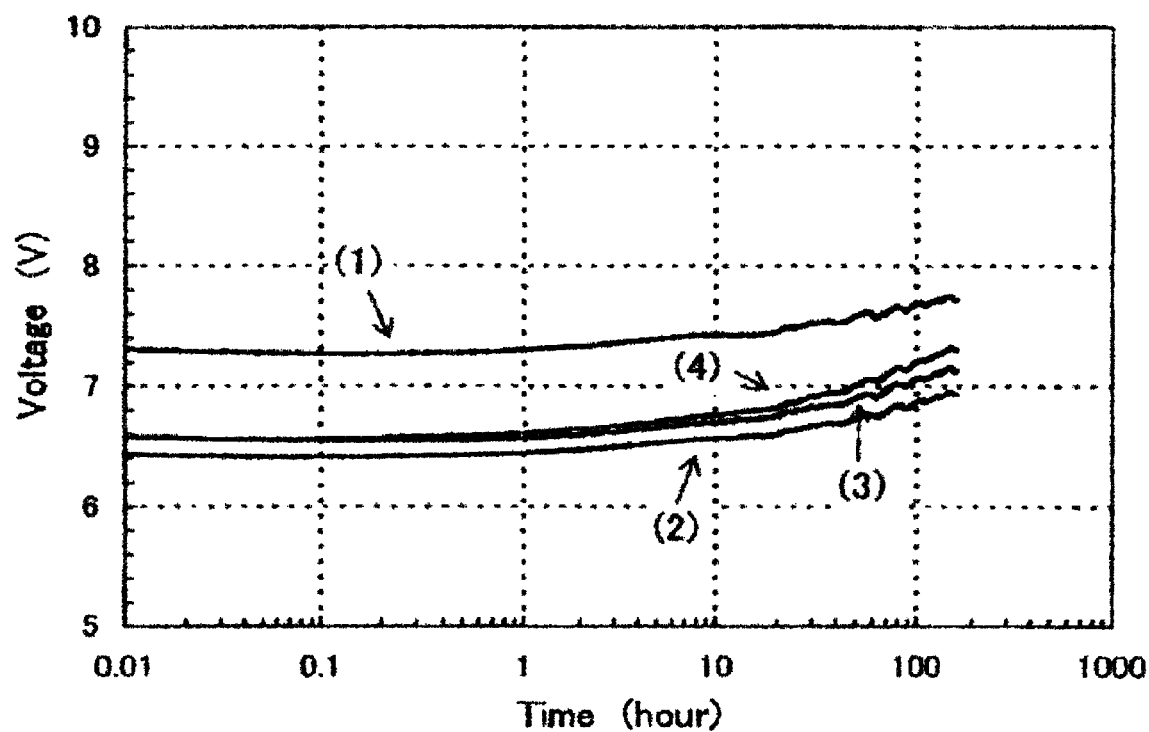
FIG. 12 is a graph showing results obtained by measuring a change in voltage with time of a light-emitting element according to the present invention.
Figure 13:
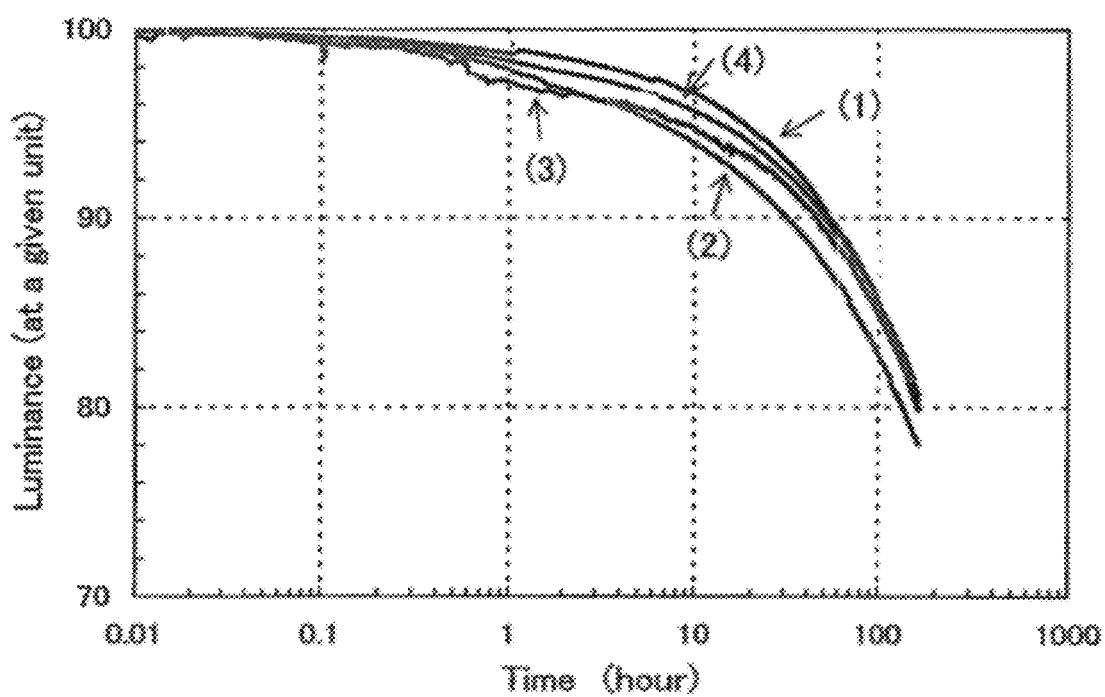
FIG. 13 is a graph showing results obtained by measuring a change in luminance with time of a light-emitting element according to the present invention.

As apparent in FIG. 10, the light-emitting element of the present invention under an initial condition requires the current density of 26.75 $mA/cm^2$ to emit light at the luminance of 3,000 $cd/m^2$. In this embodiment, the change in voltage with time that was required for flowing the current of 26.75 $mA/cm^2$ and the change in luminance with time were examined while keeping feeding the current of 26.75 $mA/cm^2$ for a certain period. The measurement results are shown in FIG. 12 and FIG. 13. In FIG. 12, the horizontal axis represents time passage (hour) while the vertical axis represents voltage (V) required for flowing the current of 26.75 $mA/cm^2$. Also, in FIG. 13, the horizontal axis represents time passage (hour) while the vertical axis represents the luminance (at a given unit). Further, the luminance (at a given unit) is a relative value to the initial luminance (i.e., the luminance at a given time is divided by the initial luminance and then multiplied by 100), wherein the luminance in an initial condition is expressed as 100.

According to FIG. 12, it is known that the voltage required for flowing the current with the current density of 26.75 $mA/cm^2$ is increased by only 1 V from the initial condition after a lapse of 100 hours. Consequently, it is known that the light-emitting elements of the present invention are favorable elements having less increase in voltage with time passage.

Embodiment 2

Figure 14:
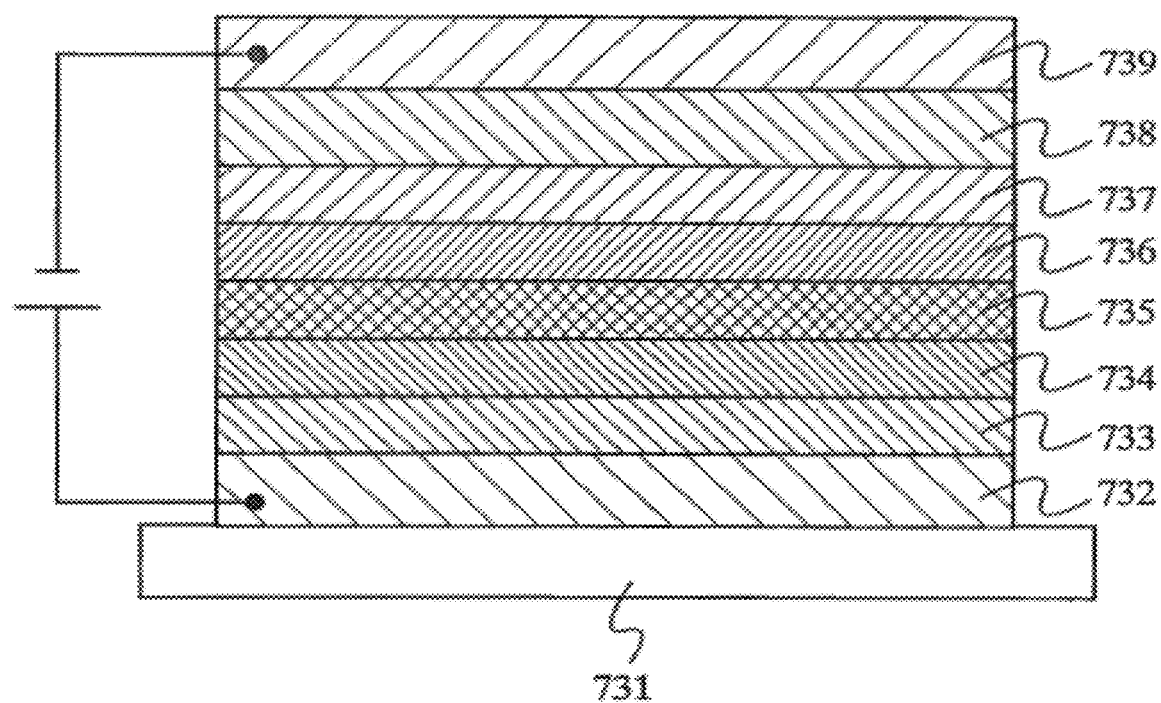
FIG. 14 shows a stacked structure of a light-emitting element according to the present invention.

A method for manufacturing a light-emitting element of the present invention will be described below with reference to FIG. 14.

Indium tin oxide containing silicon was formed over a substrate 731 by sputtering to form a second electrode 732. The thickness of the second electrode 732 was set to be 110 nm. Further, a substrate made of glass was used as the substrate 731.

Next, a layer 733 including molybdenum oxide (VI) and NPB was formed on the second electrode 732 by co-evaporation of the molybdenum oxide and the NPB. The thickness of the layer 733 was set to be 50 nm. The molybdenum oxide-the NPB weight ratio was adjusted to satisfy 0.2:2 (=molybdenum oxide:NPB)

Subsequently, a layer 734 including NPB was formed on the layer 733 by vacuum evaporation of the NPB. The thickness of the layer 734 was set to be 10 nm.

A layer 735 including tris(8-quinolinolato)aluminum ($Alq_3$) and coumarin 6 was formed on the layer 734 by co-evaporation of the $Alq_3$ and the coumarin 6. The weight ratio of $Alq_3$ to coumarin 6 was adjusted to 1:0.005 (i.e. $Alq_3$:coumarin 6) so that the coumarin 6 was dispersed in $Alq_3$. The thickness of the layer 735 was set to be 35 nm. Further, the co-evaporation is an evaporation method that is performed simultaneously from plural evaporation sources.

A layer 736 including $Alq_3$ was formed on the layer 735 by vacuum evaporation of the $Alq_3$. The thickness of the layer 736 was set to be 10 nm.

A second layer 737 including $Alq_3$ and lithium (Li) was formed on the layer 736 by co-evaporation of the $Alq_3$ and the lithium. The weight ratio of $Alq_3$ to lithium was adjusted to 1:0.01 (=$Alq_3$:Li), and the molar ratio thereof is 1.5 (=$Alq_3$/Li). The thickness of the second layer 737 was set to be 10 nm.

Next, a first layer 738 including NPB and molybdenum oxide (VI) was formed on the second layer 737 by co-evaporation of NPB and molybdenum oxide. The molar ratio between NPB and molybdenum oxide (i.e., NPB/molybdenum oxide) was adjusted to be 1.0. The thickness of the first layer 738 was set to be 20 nm.

A first electrode 739 was formed on the first layer 738 by vacuum evaporation of aluminum. The thickness of the first electrode 739 was set to be 100 nm.

When current flows through the above-manufactured light-emitting element by applying voltage thereto such that a potential of the second electrode 732 is higher than that of the first electrode 739, holes generated in the first layer 738 are injected into the first electrode 739 while electrons generated in the second layer 737 are injected into the layer 736. The holes are injected into the layer 733 from the second electrode 732. The holes injected from the second electrode 732 and the electrons injected from the second layer 737 are recombined in the layer 735, allowing the coumarin 6 to emit light. Accordingly, the layer 735 serves as a light-emitting layer. Further, the layer 733 serves as a hole injecting layer. The layer 734 serves as a hole transporting layer. The layer 736 serves as an electron transporting layer. In the light-emitting element of this embodiment, the substance included in the layer 736 and a substance with an electron transporting property included in the second layer 737 are both $Alq_3$ and their electron affinities are equal.

Comparative Example

Figure 15:
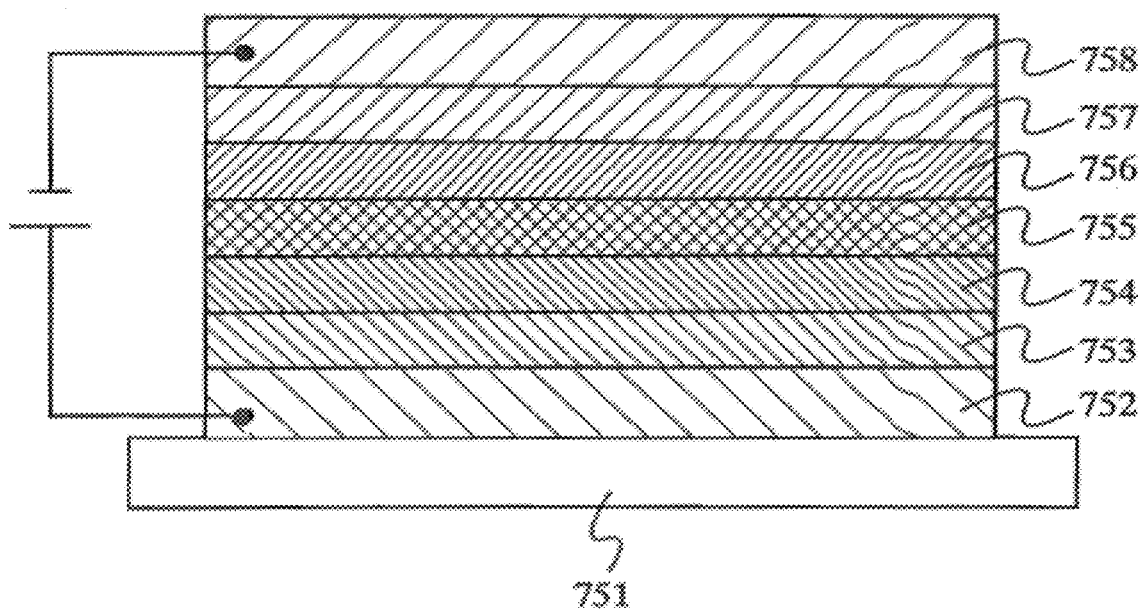
FIG. 15 shows a stacked structure of a light-emitting element as a comparative example.

Next, a method for manufacturing a light-emitting element as a comparative example will be described with reference to FIG. 15.

Indium tin oxide containing silicon was formed over a substrate 751 by sputtering to form a second electrode 752. The thickness of the second electrode 752 was set to be 110 nm. A substrate made of glass was used as the substrate 751.

Next, a layer 753 including molybdenum oxide (VI) and NPB was formed on the second electrode 752 by co-evaporation of molybdenum oxide and NPB. The thickness of the layer 753 was set to be 50 nm. The weight ratio of molybdenum oxide to NPB (=molybdenum oxide:NPB) is 0.2:1.

A layer 754 including NPB was formed on the layer 753 by vacuum evaporation of NPB. The thickness of the layer 754 was set to be 10 nm.

A layer 755 including $Alq_3$ and coumarin 6 was formed on the layer 754 by co-evaporation of $Alq_3$ and coumarin 6. The weight ratio of $Alq_3$ to coumarin 6 was adjusted to 1:0.005 (=$Alq_3$:coumarin 6) so that the coumarin 6 was dispersed in $Alq_3$. The thickness of the layer 755 was set to be 35 nm.

A layer 756 including $Alq_3$ was formed on the layer 755 by vacuum evaporation of $Alq_3$. The thickness of the layer 756 was set to be 10 nm.

Next, a second layer 757 including $Alq_3$ and lithium (Li) was formed on the layer 756 by co-evaporation of the $Alq_3$ and the lithium. The $Alq_3$-lithium weight ratio was adjusted to satisfy 1:0.01 (=$Alq_3$:Li), and the molar ratio thereof is 1.5 (=$Alq_3$/Li). The thickness of the second layer 757 was set to be 10 nm.

Next, a first electrode 758 was formed on the second layer 757 by vacuum evaporation of aluminum. The thickness of the first electrode 758 was set to be 100 nm.

The light-emitting element of the comparative example was manufactured in this manner to be compared with the light-emitting element of Embodiment 2 according to the present invention. As seen from the above, the light-emitting element of the comparative example does not include a layer corresponding to the first layer 738 of Embodiment 2.

Figure 16:
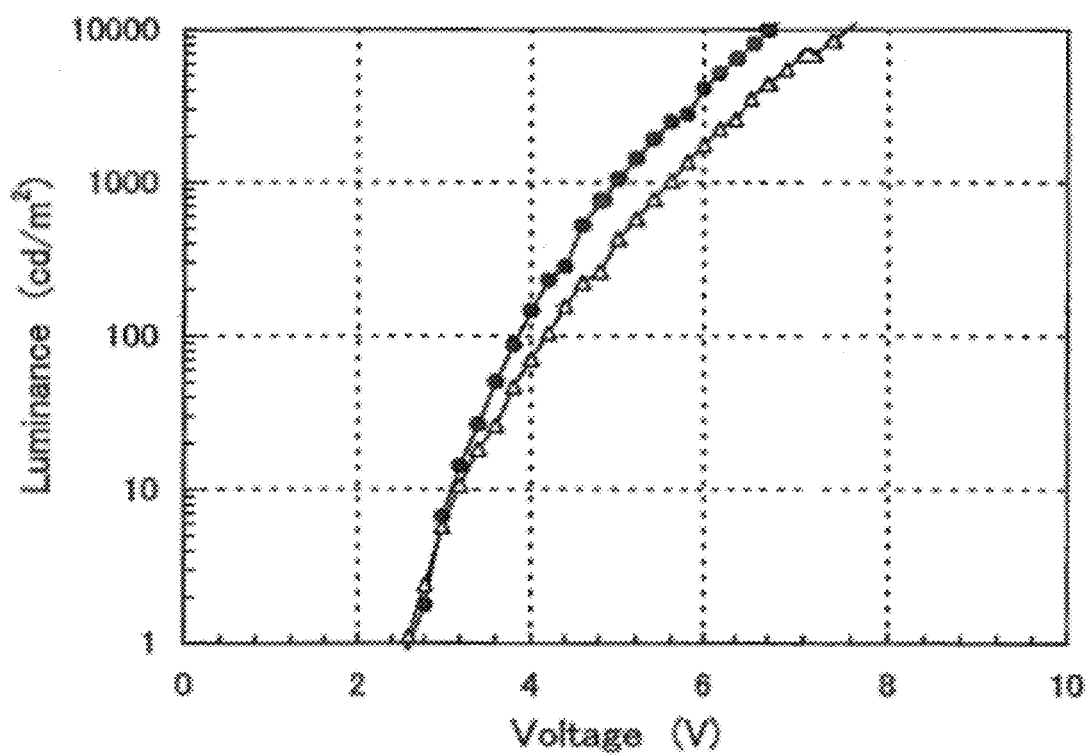
FIG. 16 is a graph showing the voltage-luminance characteristics of a light-emitting element according to the present invention and a light-emitting element as a comparative example.
Figure 17:
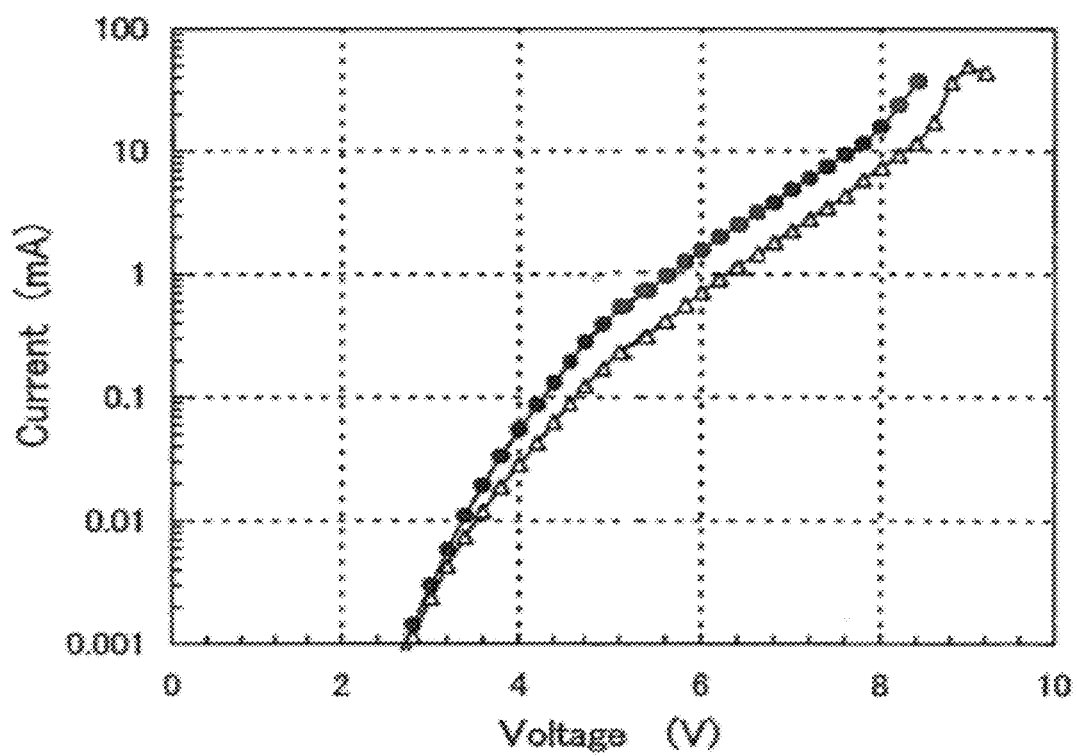
FIG. 17 is a graph showing the voltage-current characteristics of a light-emitting element according to the present invention and a light-emitting element as a comparative example.

The voltage-luminance characteristics of the light-emitting element in Embodiment 2 and the light-emitting element of the comparative example are shown in FIG. 16 while the voltage-current characteristics thereof are shown in FIG. 17. In FIG. 16, the horizontal axis represents voltage (V) and the vertical axis represents luminance ($cd/m^2$). In FIG. 17, the horizontal axis represents voltage (V) and the vertical axis represents current (mA). In FIG. 16 and FIG. 17, a line marked by ● indicates the characteristics of the light-emitting element of Embodiment 2 (the present invention) whereas a line marked by ▲ indicates the characteristics of the light-emitting element of the comparative example.

According to FIG. 16, it is known that the luminance of the light-emitting element of the present invention, which is obtained in applying a predetermined voltage thereto, is higher than that of the light-emitting element of the comparative example. In addition, it is known that the amount of current flowing through the light-emitting element of the present invention upon applying the predetermined voltage thereto is larger than that of the light-emitting element of the comparative example according to FIG. 17. Consequently, the light-emitting element of the present invention is a favorable element capable of operating at low driving voltage.

Each of the light-emitting elements as shown in Embodiment 1 and Embodiment 2 comprises layers functioning as a hole injecting layer, a hole transporting layer, an electron transporting layer and the like, together with a layer functioning as a light-emitting layer. However, these layers are not necessarily formed. Further, after forming the layer functioning as the light-emitting layer, the layer generating electrons is formed, followed by forming the layer generating holes in Embodiment 1 and Embodiment 2. However, a method for manufacturing the light-emitting element according to the present invention is not limited thereto. For example, after forming a layer generating the holes, a layer generating electrons may be formed, followed by forming a layer including a layer functioning as a light-emitting layer.

Embodiment 3

Figure 18:
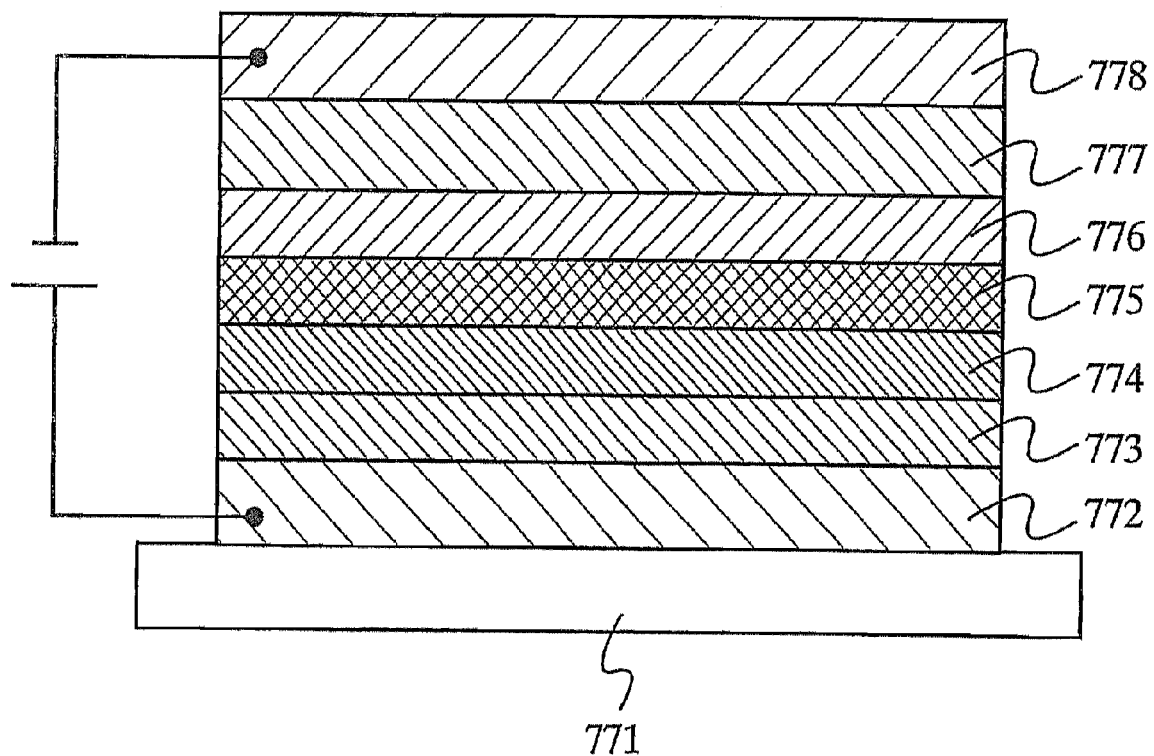
FIG. 18 shows a stacked structure of a light-emitting element according to the present invention.

Methods for manufacturing seven light-emitting elements having different thicknesses. of layers generating holes (i.e., a light-emitting element (5), a light-emitting element (6), a light-emitting element (7), a light-emitting element (8), a light-emitting element (9), a light-emitting element (10) and a light-emitting element (11)), and characteristics of these elements will be described in this embodiment with reference to FIG. 18.

Indium tin oxide was formed over a substrate 771 by sputtering to form a second electrode 772 with a thickness of 110 nm. A substrate made of glass was used as the substrate 771.

A layer 773 including CuPC was formed on the second electrode 772 by vacuum evaporation of the CuPC. The thickness of the layer 773 was set to be 20 nm.

Then, a layer 774 including NPB was formed on the layer 773 by vacuum evaporation of NPB. The thickness of the layer 774 was set to be 40 nm.

Next, a layer 775 including $Alq_3$ and coumarin 6 was formed on the layer 774 by co-evaporation of $Alq_3$ and coumarin 6. The weight ratio of $Alq_3$ to coumarin 6 was adjusted to satisfy 1:0.003 (=$Alq_3$:coumarin 6) so that the coumarin 6 was dispersed in the $Alq_3$. The thickness of the layer 775 was set to be 40 nm.

A second layer 776 including $Alq_3$ and lithium (Li) was formed on the layer 775 by co-evaporation of $Alq_3$ and lithium. The $Alq_3$-lithium weight ratio was adjusted to satisfy 1:0.01, and the molar ratio thereof is 1.5 (=$Alq_3$/Li). The thickness of the second layer 776 was set to be 30 nm.

Next, a first layer 777 including NPB and molybdenum oxide was formed on the second layer 776 by co-evaporation of NPB and molybdenum oxide. The molar ratio of NPB and molybdenum oxide (i.e., molybdenum oxide/NPB) was set to be 1.25. At this moment, in the light-emitting element (5), the thickness of the first layer 777 was set to be 0 nm. That is, the first layer 777 was not formed in the light-emitting element (5). In the light-emitting element (6), the thickness of the first layer 777 was set to be 100 nm. In the light-emitting element (7), the thickness of the first layer 777 was set to be 120 nm. In the light-emitting element (8), the thickness of the first layer 777 was set to be 140 nm. In the light-emitting element (9), the thickness of the first layer 777 was set to be 160 nm.

In the light-emitting element (10), the thickness of the first layer 777 was set to be 180 nm. In the light-emitting element (11), the thickness of the first layer 777 was set to be 200 nm.

Subsequently, a first electrode 778 was formed on the first layer 777 by vacuum evaporation of aluminum. The thickness of the first electrode 778 was set to be 100 nm.

When current flows through each of the thusly formed light-emitting elements by applying voltage thereto such that a potential of the second electrode 772 is higher than that of the first electrode 778, holes generated in the first layer 777 are injected into the first electrode 778 while electrons generated in the second layer 776 are injected into the layer 775. The holes are injected into the layer 773 from the second electrode 772. The holes injected from the second electrode 772 and the electrons injected from the second layer 776 are recombined in the layer 775, allowing the coumarin 6 to emit light. Accordingly, the layer 775 serves as a light-emitting layer. Further, the layer 773 serves as a hole injecting layer. The layer 774 serves as a hole transporting layer. In each light-emitting element of this embodiment, the substance included in the layer 775 and a substance with an electron transporting property included in the second layer 776 are both $Alq_3$ and their electron affinities are equal.

Figure 19:
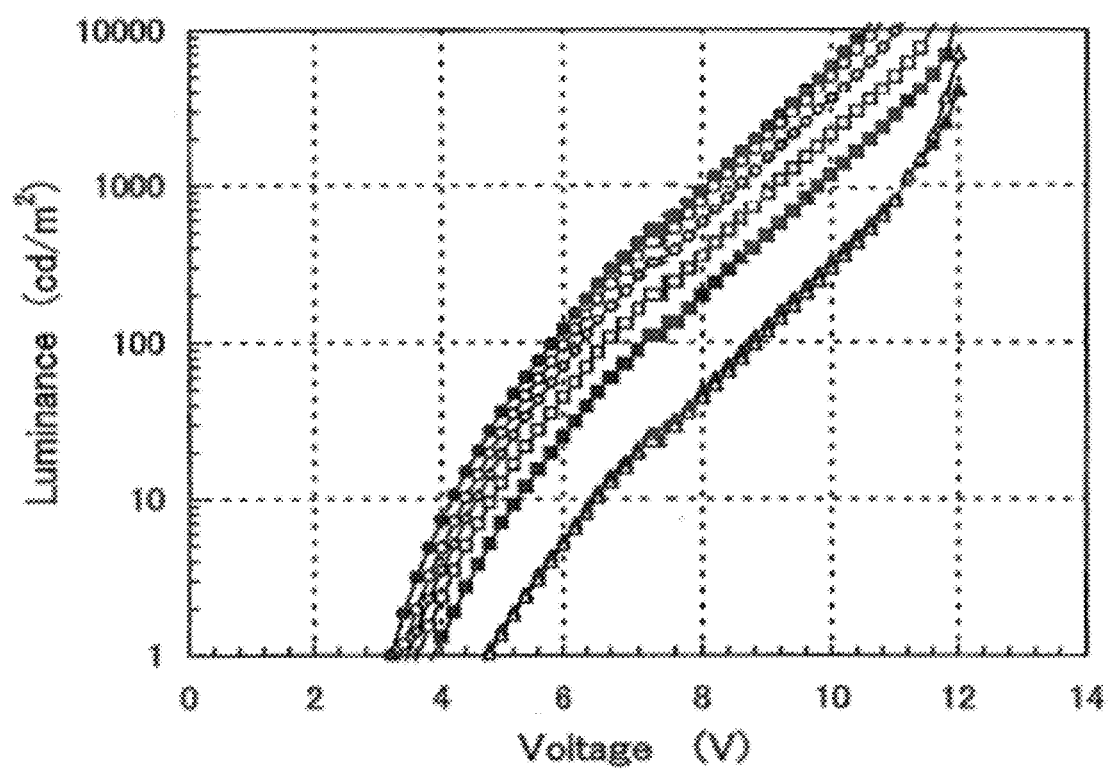
FIG. 19 is a graph showing the voltage-luminance characteristics of a light-emitting element according to the present invention.
Figure 20:
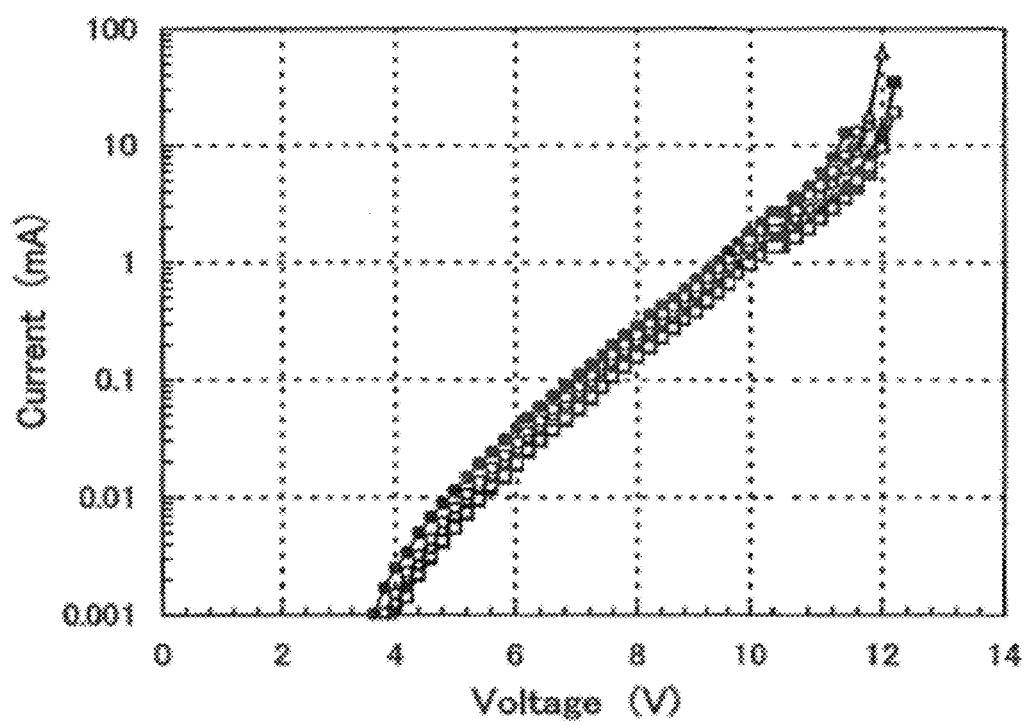
FIG. 20 is a graph showing the voltage-current characteristics of a light-emitting element according to the present invention.
Figure 21:
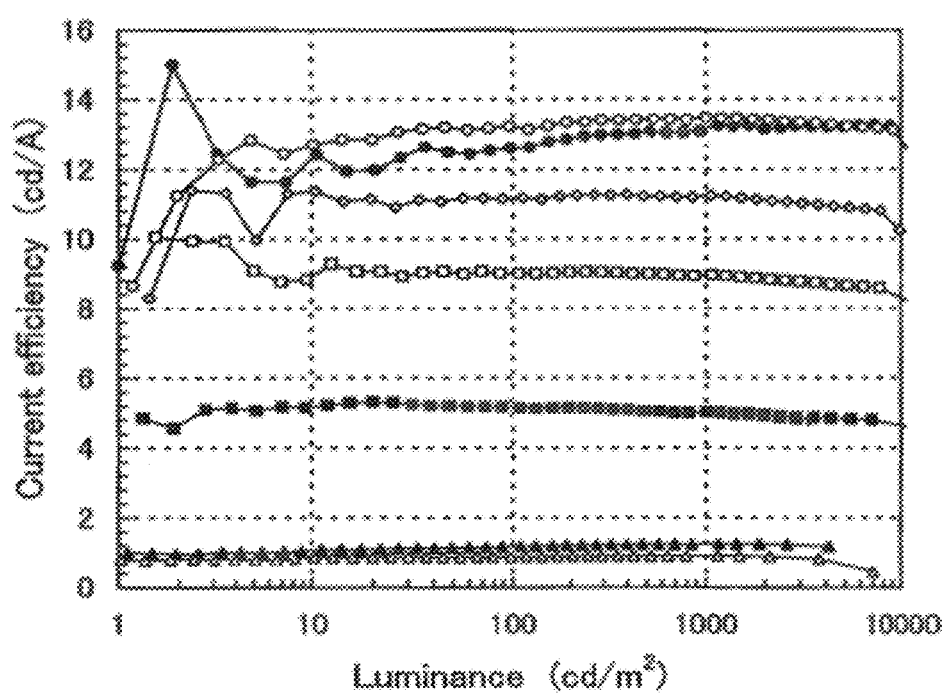
FIG. 21 is a graph showing the luminance-current efficiency characteristics of a light-emitting element according to the present invention.

FIG. 19 shows the voltage-luminance characteristics of the light-emitting elements of this embodiment, FIG. 20 shows the voltage-current characteristics thereof, and FIG. 21 shows the luminance-current efficiency characteristics thereof. In FIG. 19, the horizontal axis represents voltage (V) while the vertical axis represents luminance ($cd/m^2$). In FIG. 20, the horizontal axis represents voltage (V) while the vertical axis represents current (mA). In FIG. 21, the horizontal axis represents luminance ($cd/m^2$) while the vertical axis represents current efficiency (cd/A). In FIGS. 19, 20 and 21, curves marked by ● indicate the characteristics of the light-emitting element (5), curves marked by ▲ indicate the characteristics of the light-emitting element (6), curves marked by A indicate the characteristics of the light-emitting element (7), curves marked by ▨ indicate the characteristics of the light-emitting element (8), curves marked by □ indicate the characteristics of the light-emitting. element (9), curves marked by ◇ indicate the characteristics of the light-emitting element (10), and curves marked by ○ indicate the characteristics of the light-emitting element (11).

According to FIG. 20, it is known that there are almost no changes in the amount of current that flows through each of the light-emitting elements upon applying a given voltage to the light-emitting elements even when the thicknesses of the first layers 777 having a function of generating holes are varied. Meanwhile, it is also known that the luminance upon applying the given voltage to each of the light-emitting elements is varied greatly depending on the thicknesses of the first layers 777 according to FIG. 19.

Figure 22:
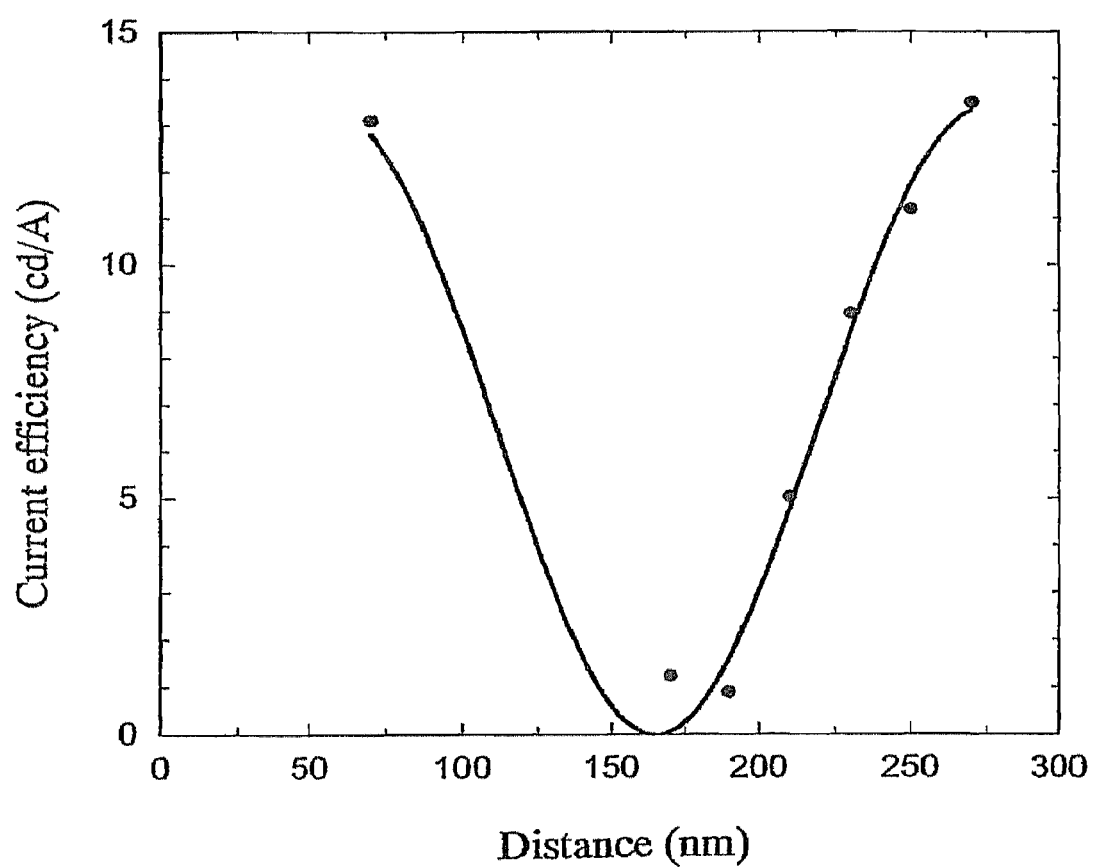
FIG. 22 is a graph showing results obtained by measuring a change in current efficiency (cd/A) with respect to the distance (nm) between a layer 775 and a first electrode 778.

FIG. 22 is a graph in which the current efficiency (cd/A) with respect to a distance (nm) between the layer 775 and the first electrode 778 is plotted (marked by ●). The curve in FIG. 22 is an approximated curve showing the change in current efficiency. Further, the current efficiency is obtained when the light-emitting element emits light at the luminance of 1,000 $cd/m^2$. In FIG. 22, the horizontal axis represents the distance (nm) while the vertical axis represents current efficiency cd/A). According to FIG. 22, it is known that the current efficiency is changed depending on the distance between the layer 775 and the first electrode 778 (i.e., a sum of the film thicknesses of the layer 775, the second layer 776 and the first layer 777), and the current efficiency is gradually increased when the distance between the layer 775 and the first electrode 778 is more than 200 nm. It is thought that this phenomenon is caused due to the effect of interference of light, wherein when an optical distance between a light-emitting region and the first electrode (i.e., reflectance×distance) is the emission wavelength multiplied by (2m−1)/4 (i.e., ¼, ¾, ⁵⁄₄ . . . ), the light extraction efficiency is increased, whereas when the optical distance therebetween is the emission wavelength multiplied by m/2 (i.e., ½, 1, ³⁄₂ . . . ), the light extraction efficiency is reduced. Consequently, in this embodiment, by setting the thickness of the first layer 777 to be more than 160 nm, light generated in the light-emitting layer can be emitted to the outside effectively, as well as preventing a short circuit between the electrodes. In addition, a light-emitting element having less increase in the resistance value that is caused by increase in thickness can be obtained.

Figure 23A:
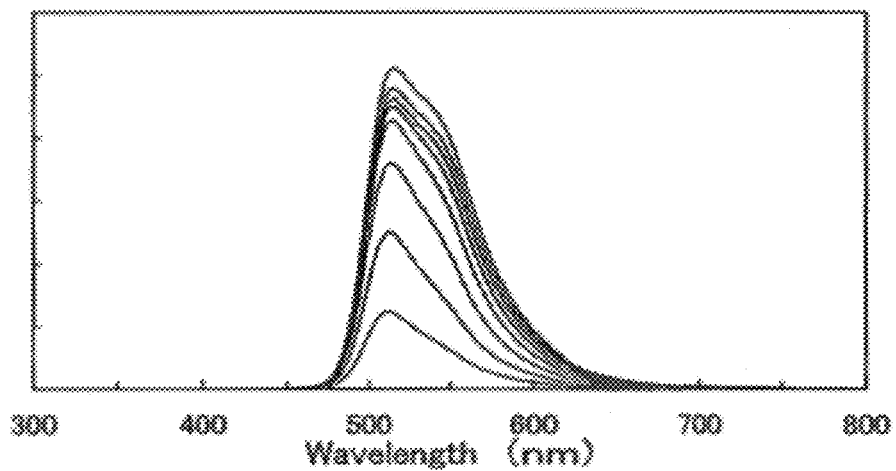
FIGS. 23A to 23C are graphs showing results obtained by measuring a change in shape of light emission spectrum depending on the angle between a light-extraction surface and a viewer's line of sight.
Figure 23B:
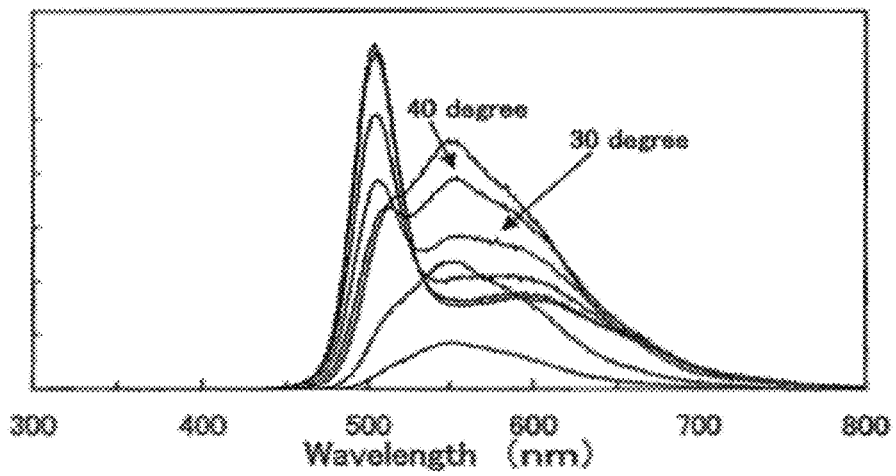
Figure 23C:
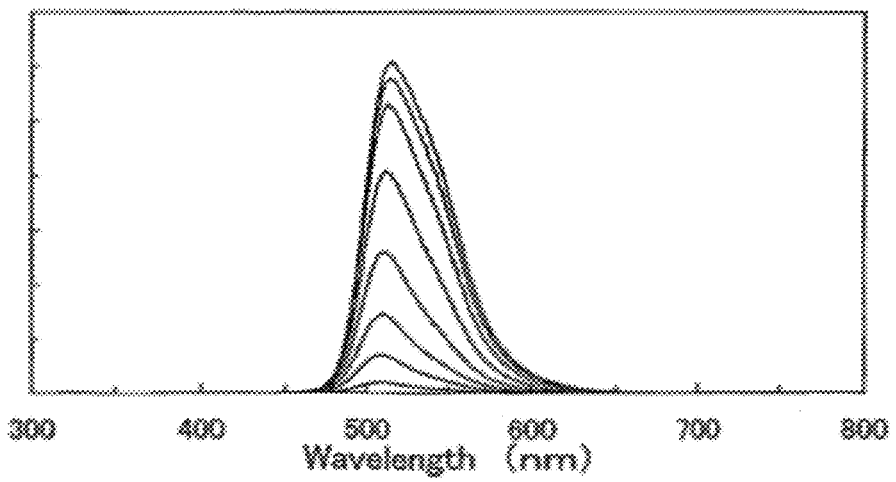

The results of measuring the change in emission spectrum depending on the angle between the light-extraction surface and the viewer's line of sight, as for the light-emitting elements (5), (7) and (11), are shown in FIGS. 23A, 23B and 23C, respectively. In FIGS. 23A, 23B and 23C, the horizontal axis represents a wavelength (nm) while the vertical axis represents the emission intensity (at a given unit).

The emission spectrum is measured by changing the angle between the light-extraction surface and the viewer's line of sight, i.e., the angle between a normal line of the light-extraction surface and a normal line of a measurement surface of a measuring apparatus, every 10 degrees in the range of 0 to 70 degrees.

FIG. 23A shows the results of measuring the change in emission spectrum of the light-emitting element (5). FIG. 23B shows the results of measuring the change in emission spectrum of the light-emitting element (7). FIG. 23C shows the results of measuring the change in emission spectrum of the light-emitting element (11).

In FIG. 23B, the emission spectrum is changed depending on the angle between the light-extraction surface and the viewer's line of sight. In other words, when the angle is less than 30 degrees, the emission spectrum with about 507 nm shows a maximal value of the emission intensity, whereas, when the angle is more than 40 degrees, the emission spectrum with about 555 nm shows a maximal value of the emission intensity. Accordingly, it is known that the shape of the emission spectrum of the light-emitting element (7) is largely changed depending on the change in angle; therefore, there is a large change in emission spectrum depending on the angle between the light-extraction surface and the viewer's line of sight. On the other hand, in FIGS. 23A and 23C, although the emission intensity is reduced with increasing the angle between the light-extraction surface and the viewer's line of sight, the wavelength showing a maximal value of emission intensity is not changed. Accordingly, it is known that as for the light-emitting elements (5) and (11), there is almost no variation in the shape of emission spectrum in accordance with the change in angle, resulting in less variation in emission spectrum depending on the angle between the light-extraction surface and the viewer's line of sight.

Embodiment 4

In Embodiment 4, a manufacturing method of two light-emitting elements (12) and (13) which were formed using lithium oxide according to the present invention, and characteristics of the two light-emitting elements (12) and (13) are described with reference to FIGS. 25 to 28.

A film of indium tin oxide including silicon was formed over a substrate 551 by sputtering to form a second electrode 552 with a thickness of 110 nm. Here, a substrate made of glass was used as the substrate 551.

Next, a layer 553 including molybdenum oxide (VI) and NPB was formed on the second electrode 552 by co-evaporation of the, molybdenum oxide and the NPB. Here, the weight ratio of the molybdenum oxide and TPAQn was adjusted to be 1:4 (=molybdenum oxide:NPB) in the layer 553. The thickness of the layer 553 was set to be 50 nm in each light-emitting element. Note that co-evaporation mentioned here is a type of vacuum evaporation method, and is an evaporation method in which evaporation from plural evaporation sources provided in one treatment chamber is carried out at the same time.

A layer 554 including NPB was sequentially formed on the layer 553 by vacuum evaporation of NPB. The thickness of the layer 554 was set to be 10 nm.

A layer 555 including tris(8-quinolinolato)aluminum ($Alq_3$) and coumarin 6 was formed on the layer 554 by co-evaporation of $Alq_3$ and coumarin 6. The weight ratio of $Alq_3$ to coumarin 6 (i.e., $Alq_3$:coumarin 6) was adjusted to be 1:0.01 so that the coumarin 6 was dispersed in the $Alq_3$. The thickness of the layer 555 was made to be 40 nm.

Next, $Alq_3$ was deposited on the layer 555 by vacuum evaporation to form a layer 556 including $Alq_3$ with a thickness of 20 nm.

A second layer 557 including $Alq_3$ and lithium oxide ($LiO_2$) was formed on the layer 556 by co-evaporation of the $Alq_3$ and the lithium oxide. The weight ratio of $Alq_3$ to lithium oxide (i.e., $Alq_3$:lithium oxide) was adjusted to be 1:0.01 in the light-emitting element (12). The weight ratio of $Alq_3$ to lithium oxide (i.e., $Alq_3$: lithium oxide) was adjusted to be 1:0.05, and when converted into a molar ratio, the molar ratio is 1.3 (=$Alq_3$:lithium oxide) in the light-emitting element (13). The thickness of the layer 557 was made to be 10 nm.

Then, a first layer 558 including NPB and molybdenum oxide (VI) is formed by co-evaporation of NPB and molybdenum oxide. The molar ratio of NPB and molybdenum oxide (=NPB4/molybdenum oxide) here is 1 and the weight ratio thereof (=NPB:molybdenum oxide) is 4:1. The thickness of the film was made to be 10 nm.

Aluminum was deposited over the layer 558 by a vacuum evaporation method to form a first electrode 559. The thickness of the film was made to be 100 nm.

When a current flows through each of the above-manufactured light-emitting element by applying voltage thereto such that a potential of the second electrode 552 is higher than that of the first electrode 559, holes generated in the first layer 558 are injected into the first electrode 559 while electrons generated in the second layer 557 are injected into the layer 556, and the holes are injected into the layer 553 from the second electrode 552. Further, the holes injected from the second electrode 552 and the electrons injected from the second layer 557 are recombined in the layer 555 so that the coumarin 6 emits light. Accordingly, the layer 555 serves as a light-emitting layer. Further, the layer 553 serves as a hole injecting layer. The layer 554 serves as a hole transporting layer. The layer 556 serves as an electron transporting layer. In each light-emitting element in this embodiment, a substance forming the layer 556 and the electron transporting substance included in the layer 557 are both $Alq_3$ and their electron affinities are equal.

Figure 26:
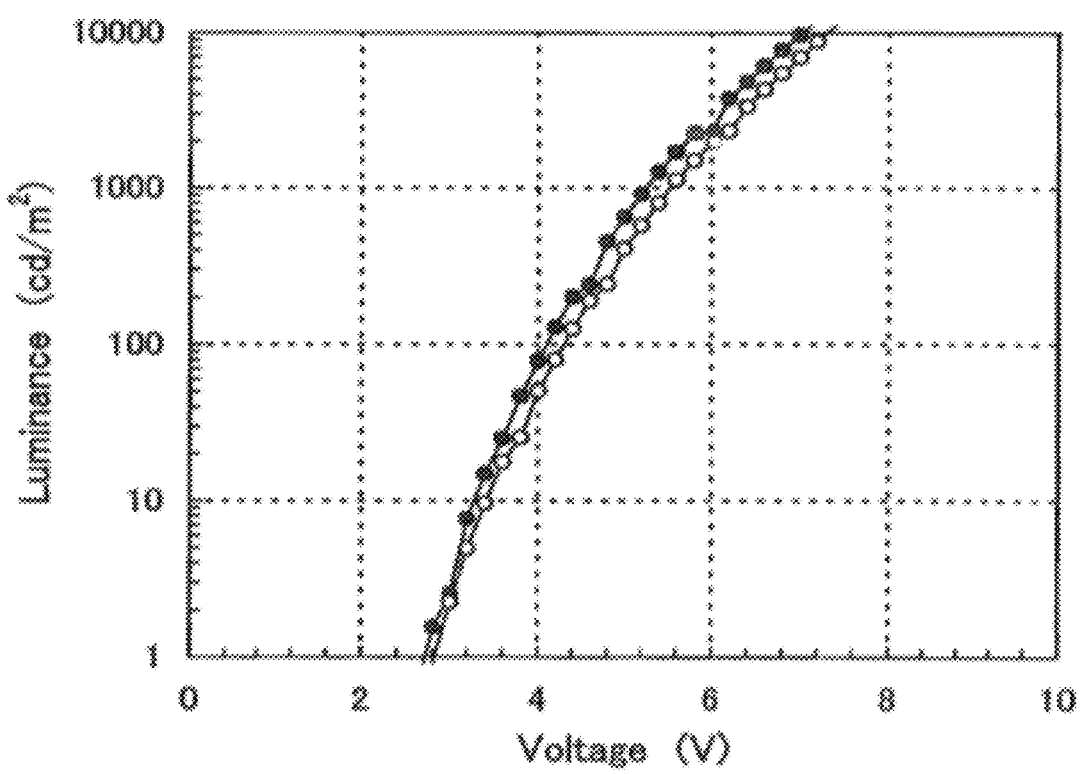
FIG. 26 is a graph showing the voltage-luminance characteristics of a light-emitting element according to the present invention.
Figure 27:
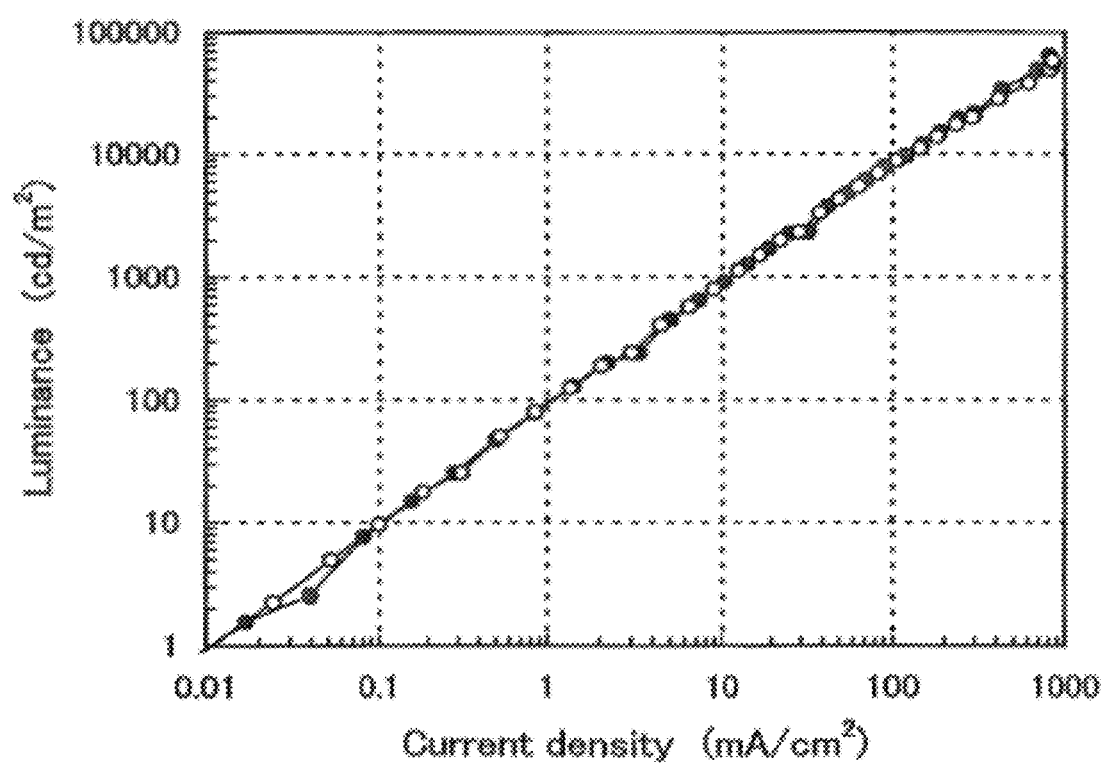
FIG. 27 is a graph showing the current density-luminance characteristics of a light-emitting element according to the present invention.
Figure 28:
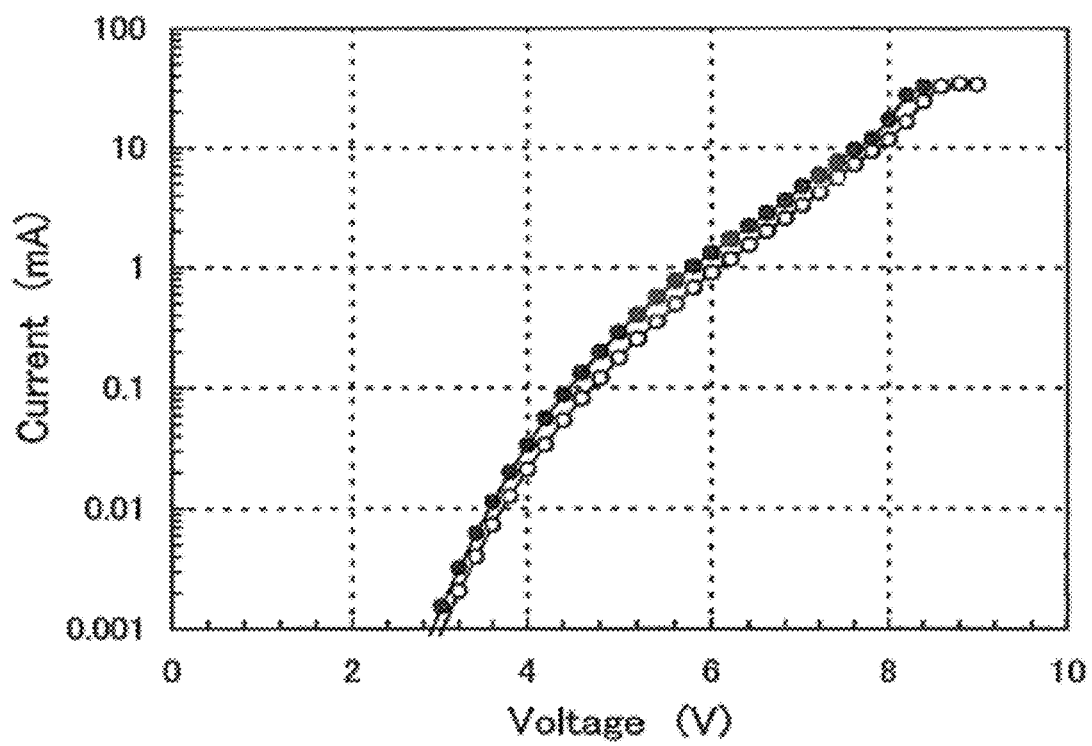
FIG. 28 is a graph showing the luminance-current characteristics of a light-emitting element according to the present invention.

FIG. 26 shows the voltage-luminance characteristics of the light-emitting elements manufactured in this embodiment. FIG. 27 shows the current density-luminance characteristics of the light-emitting elements manufactured in this embodiment. FIG. 28 shows the voltage-current characteristics of the light-emitting elements manufactured in this embodiment. In FIG. 26, the horizontal axis represents voltage (V) while the vertical axis represents luminance ($cd/m^2$). In FIG. 27, the horizontal axis represents current density ($mA/cm^2$) while the vertical axis represents luminance ($cd/m^2$). In FIG. 28, the horizontal axis represents voltage (V) while the vertical axis represents current (mA). In FIGS. 26 to 28, a line marked by the symbol ● indicates characteristics of the light-emitting element (12) and a line marked by the symbol ○ indicates characteristics of the light-emitting element (13).

As apparent from FIGS. 26 to 28, each of the light-emitting elements having the structure of the present embodiment, operates favorably. As shown in this embodiment, a light-emitting element of the present invention can be manufactured even when the layer 557 is formed using lithium oxide.

Embodiment 5

Embodiment 5 describes an experiment for confirming that a layer including an aromatic amine compound and a substance showing a electron accepting property to the aromatic amine compound generated holes, and results thereof.

In this embodiment, seven samples were prepared, which were sample 1, sample 2 and sample 3, formed using an aromatic amine compound only; sample 4, sample 5 and sample 6, formed using an aromatic amine compound and a substance showing electrons accepting property to the aromatic amine compound; and sample 7 formed using only a substance showing an electron accepting property to an aromatic amine compound.

As the samples 1 to 3, a layer containing an aromatic amine compound was deposited to have a thickness of 50 nm over a glass substrate by a vacuum evaporation method. As the samples 4 to 6, a layer containing an aromatic amine compound and a substance showing an electron accepting property to the aromatic amine compound was deposited to have a thickness of 50 nm over a glass substrate by a co-evaporation method. In the sample 4 to 6, the molar ratio of the aromatic amine compound against a substance showing an electron accepting property to the aromatic amine compound (i.e. the aromatic amine compound: a substance showing an electron accepting property to the aromatic amine compound) was set at 1:1. As the sample 7, a layer containing a substance showing an electron accepting property to an aromatic amine compound was deposited to have a thickness of 50 nm over a glass substrate by a vacuum evaporation method.

Table 1 shows the aromatic amine compounds (A) and the substances showing an electron accepting property to the aromatic amine compounds (B), which are contained in the samples.

TABLE 1

| Sample | A | B |
|---|---|---|
| 1 | NPB | — |
| 2 | m-MTDAB | — |
| 3 | TPAQn | — |
| 4 | NPB | Molybdenum Oxide |
| 5 | m-MTDAB | Molybdenum Oxide |
| 6 | TPAQn | Molybdenum Oxide |
| 7 | — | Molybdenum Oxide |

The samples 1 to 7 were irradiated with light of which the wavelength was changed during the irradiation in the range of about 300 nm to 800 nm, and the transmittance of the light that passed through the layers formed in each sample was examined. The transmittance spectra thus obtained are shown in FIGS. 29A to 29C.

Figure 29A:
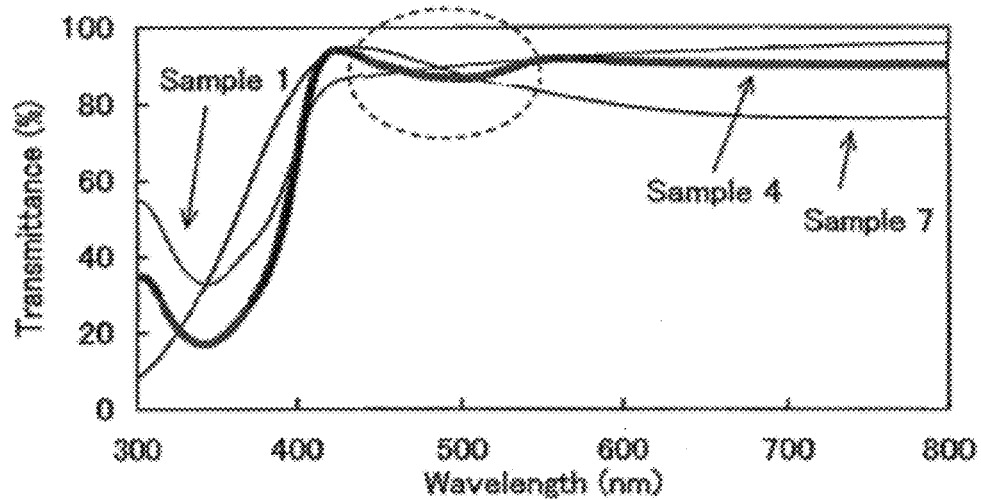
FIGS. 29A to 29C are each a graph showing transmittance spectra of samples 1 to 7.
Figure 29B:
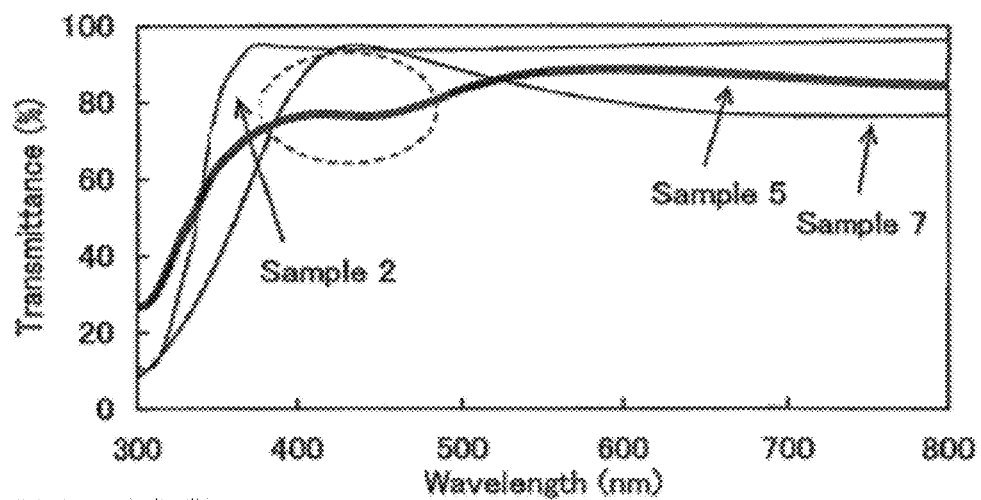
Figure 29C:
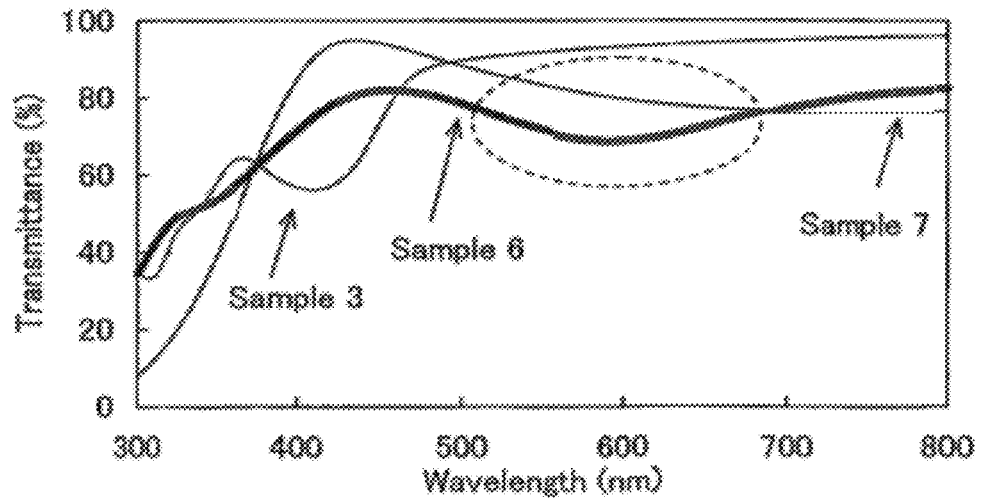

In FIGS. 29A to 29C, the horizontal axis indicates the wavelength (nm) of emitted light and the vertical axis indicates the transmittance (%). FIG. 29A shows transmittance spectra of the samples 1, 4 and 7; FIG. 29B shows transmittance spectra of the samples 2, 5 and 7; and FIG. 29C shows transmittance spectra of the samples 3, 6 and 7. According to FIGS. 29A to 29C, it can be understood that, in the wavelength band of 400 nm to 600 nm, the samples 4 to 6 show a tendency that the transmittance decreases and then increases (portions circled by a dotted line), while the samples 1 to 3 and 7 show a tendency that the transmittance either decreases or increases only and have no maximum values, when transmittance spectra of the samples 4 to 6 are compared with those of the samples 1 to 3 and 7. This result means that electron transfer is carried out between the aromatic amine compound and the substance showing an electron accepting property to the aromatic amine compound in the samples 4 to 6. Therefore, the substance showing an electron accepting property to the aromatic amine compound receives electrons from the aromatic amine compound, and thus the aromatic amine compound is positively charged. In other words, it can be considered that holes were generated in the samples 4 to 6.

EXPLANATION OF REFERENCE

10: substrate, 11: transistor, 12: light-emitting element, 13: first electrode, 14: second electrode, 15: layer, 16: interlayer insulating film, 16a: interlayer insulating film, 16b: interlayer insulating film, 16c: interlayer insulating film, 17: wiring, 18: partition layer, 19: interlayer insulating film, 19a: interlayer insulating film, 19b: interlayer insulating film, 201: first electrode, 202: second electrode, 211: first layer, 212: second layer, 213: third layer, 221: election transporting layer, 222: light-emitting layer, 223: hole transporting layer, 224: hole injecting layer, 301: first electrode, 302: second electrode, 311: first layer, 312: second layer, 313: third layer, 321: electron transporting layer, 322: light-emitting layer, 323: hole transporting layer, 324: hole injecting layer, 501: sub frame period, 502: sub frame period, 503: sub frame period, 504: sub frame period, 501a: write period, 501b: retention period, 502a: write period, 502b: retention period, 503a: write period, 503b: retention period, 504a: write period, 504b: retention period, 504c: erase period, 504d: non-light emitting period, 551: substrate, 552: second electrode, 553: layer, 554: layer, 555: layer, 556: layer, 557: second layer, 558: first layer, 559: first electrode, 701: substrate, 702: second electrode, 703: layer, 704: layer, 705: layer, 706: layer, 707: second layer, 708: first layer, 709: first electrode, 731: substrate, 732: second electrode, 733: layer, 734: layer, 735: layer, 736: layer, 737: second layer, 738: first layer, 739: first electrode, 751: substrate, 752: second electrode, 753: layer, 754: layer, 755: layer, 756: layer, 757: second layer, 758: first electrode, 771: substrate, 772: second electrode, 773: layer, 774: layer, 775: layer, 776: second layer, 777: first layer, 778: first electrode, 901: first transistor, 902: second transistor, 903: light-emitting element, 911: gate signal line, 912: source signal line, 913: writing gate signal line driver circuit, 914: erasing gate signal line driver circuit, 915: source signal line driver circuit, 916: power source, 917: current supply line, 918: switch, 919: switch, 920: switch, 951: substrate, 952: electrode, 953: insulating layer, 954: partition layer, 955: layer, 956: electrode, 1001: first transistor, 1002: second transistor, 1003: gate signal line, 1004: source signal line, 1005: current supply line, 1006: electrode, 5521: main body, 5522: casing, 5523: display portion, 5524: keyboard, 5531: display portion, 5532: casing, 5533: speaker, 5551: display portion, 5552: main body, 5553: antenna, 5554: audio output portion, 5555: audio input portion, 5556: operation switch, 5557: operation switch, 6500: substrate, 6503: FPC (flexible printed circuit), 6504: printed wiring board (PWB), 6511: pixel portion, 6512: source signal line driver circuit, 6513: writing gate signal line driver circuit, 6514: erasing gate signal line driver circuit.

What is claimed is:

1. A method for manufacturing a light-emitting element comprising:
    forming a first layer comprising molybdenum and a first compound by evaporation;
    forming a second layer comprising the first compound over the first layer by evaporation;
    forming a third layer comprising a second compound and a third compound over the second layer by evaporation;
    forming a fourth layer comprising the second compound over the third layer by evaporation; and
    forming a fifth layer comprising lithium and the second compound over the fourth layer.

2. A method for manufacturing a light-emitting element according to claim 1, wherein the first layer is formed by evaporating a material including molybdenum and oxygen and the first compound at the same time.

3. A method for manufacturing a light-emitting element according to claim 1, wherein the fifth layer is formed by a material including lithium and the second compound at the same time.

4. A method for manufacturing a light-emitting element according to claim 1, wherein the first compound is an aromatic amine compound.

5. A method for manufacturing a light-emitting element according to claim 1, wherein the second compound is tris(8-quinolinolato)aluminum.

6. A method for manufacturing a light-emitting element according to claim 1, wherein the third compound is coumarin 6.

7. A method for manufacturing a light-emitting element according to claim 1, wherein the light-emitting element is incorporated in at least one of a computer, a telephone, a television and a lighting appliance.

8. A method for manufacturing a light-emitting element comprising:
    forming a first layer comprising molybdenum and a first compound by evaporation;
    forming a second layer comprising the first compound over the first layer by evaporation;
    forming a third layer comprising a second compound and a third compound over the second layer by evaporation;
    forming a fourth layer comprising the second compound over the third layer by evaporation;
    forming a fifth layer comprising lithium and the second compound over the fourth layer by evaporation; and
    forming a sixth layer comprising molybdenum and the first compound over the fifth layer by evaporation.

9. A method for manufacturing a light-emitting element according to claim 8, wherein each of the first layer and the sixth layer is formed by evaporating a material including molybdenum and oxygen and the first compound at the same time.

10. A method for manufacturing a light-emitting element according to claim 8, wherein the fifth layer is formed by evaporating a material including lithium and the second compound at the same time.

11. A method for manufacturing a light-emitting element according to claim 8, wherein the first compound is an aromatic amine compound.

12. A method for manufacturing a light-emitting element according to claim 8, wherein the second compound is tris(8-quinolinolato)aluminum.

13. A method for manufacturing a light-emitting element according to claim 8, wherein the third compound is coumarin 6.

14. A method for manufacturing a light-emitting element according to claim 8, wherein the light-emitting element is incorporated in at least one of a computer, a telephone, a television and a lighting appliance.

15. A light-emitting element comprising:

a first electrode, a first layer comprising molybdenum and a first compound over and in contact with the first electrode;

a second layer comprising the first compound over the first layer;

a third layer comprising a second compound and a third compound over the second layer;

a fourth layer comprising the second compound over the third layer;

a fifth layer comprising lithium and the second compound over the fourth layer; and a second electrode over the fifth layer.

16. The light-emitting element according to claim 15, further comprising a sixth layer comprising molybdenum and the first compound between the fifth layer and the second electrode, wherein the sixth layer is in contact with the second electrode.

17. The light-emitting element according to claim 15, wherein the first compound is an aromatic amine compound.

18. The light-emitting element according to claim 15, wherein the light-emitting element is incorporated in at least one of a computer, a telephone, a television and a lighting appliance.

* * * * *

UNITED STATES PATENT AND TRADEMARK OFFICE
CERTIFICATE OF CORRECTION

PATENT NO. : 8,338,196 B2  
APPLICATION NO. : 13/196095  
DATED : December 25, 2012  
INVENTOR(S) : Daisuke Kumaki et al.

Page 1 of 1

It is certified that error appears in the above-identified patent and that said Letters Patent is hereby corrected as shown below:

At column 5, line 13, "in me art" should be --in the art--;

At column 7, line 23, "tetramethyljulolidene" should be --tetramethyljulolidine--;

At column 17, line 28, "semiamorphous Raman" should be --semiamorphous film. Raman--;

At column 19, line 42, "of, the present" should be --of the present--;

At column 25, line 36, "marked by A" should be --marked by Δ--;

At column 29, line 27, "election" should be --electron--.

Signed and Sealed this  
Ninth Day of April, 2013

Teresa Stanek Rea  
*Acting Director of the United States Patent and Trademark Office*